(12) United States Patent
Park et al.

(10) Patent No.: US 11,943,990 B2
(45) Date of Patent: Mar. 26, 2024

(54) DISPLAY DEVICE

(71) Applicant: Samsung Display Co., Ltd., Yongin-Si (KR)

(72) Inventors: Yong-Hwan Park, Hwaseong-si (KR); Soyeon Park, Yongin-si (KR); Kwanghyeok Kim, Cheonan-si (KR); Miyoung Kim, Hwaseong-si (KR); Sanghyun Jun, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 2 days.

(21) Appl. No.: 17/365,030

(22) Filed: Jul. 1, 2021

(65) Prior Publication Data

US 2022/0109028 A1    Apr. 7, 2022

(30) Foreign Application Priority Data

Oct. 5, 2020    (KR) .................. 10-2020-0128305

(51) Int. Cl.
| | | |
|---|---|---|
| *G06F 3/041* | (2006.01) | |
| *H10K 59/35* | (2023.01) | |
| *H10K 59/40* | (2023.01) | |
| *G06F 3/044* | (2006.01) | |
| *H10K 59/12* | (2023.01) | |

(52) U.S. Cl.
CPC ........... *H10K 59/40* (2023.02); *G06F 3/0412* (2013.01); *H10K 59/352* (2023.02); *G06F 3/044* (2013.01); *H10K 59/12* (2023.02)

(58) Field of Classification Search
None
See application file for complete search history.

(56) References Cited

U.S. PATENT DOCUMENTS

| | | | |
|---|---|---|---|
| 10,338,449 B2 | 7/2019 | Kang et al. | |
| 2018/0308903 A1* | 10/2018 | Jeong | .................. H01L 27/3276 |
| 2020/0119113 A1 | 4/2020 | Lee et al. | |

FOREIGN PATENT DOCUMENTS

| | | |
|---|---|---|
| KR | 10-2018-0005327 | 1/2018 |
| KR | 10-2019-0055044 | 5/2019 |
| KR | 10-2060166 | 2/2020 |
| KR | 10-2020-0042981 | 4/2020 |

* cited by examiner

*Primary Examiner* — Brian M Butcher
(74) *Attorney, Agent, or Firm* — F. Chau & Associates, LLC

(57) ABSTRACT

A display device includes: a display panel displaying an image and including a light emitting area and a non-light-emitting area adjacent to the light emitting area, wherein a light emitting element is disposed in the light emitting area; and an input sensor disposed on the display panel and comprising a sensing electrode, wherein an opening in the sensing electrode partially exposes the light emitting area, wherein the sensing electrode includes: a first touch electrode disposed to overlap the non-light-emitting area; and a second touch electrode overlapping the light emitting area and the non-light-emitting area and electrically connected to the first touch electrode.

20 Claims, 19 Drawing Sheets

DISPLAY DEVICE

CROSS-REFERENCE TO RELATED APPLICATION

This U.S. non-provisional patent application claims priority under 35 U.S.C. § 119 to Korean Patent Application No. 10-2020-0128305, filed on Oct. 5, 2020, the disclosure of which is incorporated by reference herein in its entirety.

TECHNICAL FIELD

The present inventive concept relates to a display device. More particularly, the present inventive concept relates to a display device having an input sensor.

DISCUSSION OF THE RELATED ART

Multimedia electronic devices, such as televisions, mobile phones, tablet computers, navigation units, and handheld gaming devices, include a display device to display images, Generally, the electronic devices include an input sensor that provides a touch-based input method allowing users to easily and intuitively input information or commands. In addition, the electronic devices typically include other input methods, such as a button, a keyboard, a mouse, etc.

SUMMARY

According to an embodiment of the present inventive concept, a display device includes: a display panel configured to display an image and including a light emitting area and a non-light-emitting area adjacent to the light emitting area, wherein a light emitting element is disposed in the light emitting area; and an input sensor disposed on the display panel and comprising a sensing electrode, wherein an opening in the sensing electrode partially exposes the light emitting area, Wherein the sensing electrode includes: a first touch electrode disposed to overlap the non-light-emitting area; and a second touch electrode overlapping the light emitting area and the non-light-emitting area and electrically connected to the first touch electrode.

In an embodiment of the present inventive concept, the light emitting element includes: a first light emitting element emitting a first light with a first wavelength band; a second light emitting element emitting a second light with a second wavelength band different from the first wavelength band; and a third light emitting element emitting a third light with a third wavelength band different from the first and second wavelength bands. The light emitting area includes: a first light emitting area in which the first light emitting element is disposed; a second light emitting area in which the second light emitting element is disposed; and a third light emitting area in which the third light emitting element is disposed.

In an embodiment of the present inventive concept, the second touch electrode includes: a first sensing portion overlapping at least one of the first, second, and third light emitting areas; and a second sensing portion connected to the first sensing portion and overlapping the non-light-emitting area.

In an embodiment of the present inventive concept, the second sensing portion is disposed in the non-light-emitting area and spaced apart from the first touch electrode.

In an embodiment of the present inventive concept, the second touch electrode includes: a first portion overlapping the first light emitting area; a second portion overlapping the second light emitting area; and a third portion overlapping the third light emitting area.

In an embodiment of the present inventive concept, at least one of the first, second, and third portions has a width greater than a width of the remainder of the first, second, and third portions.

In an embodiment of the present inventive concept, the first light is a red light, the second light is a green light, and the third light is a blue light, and wherein the width of the third portion is greater than the width of each of the first and second portions, and the width of the first portion is greater than the width of the second portion.

In an embodiment of the present inventive concept, the third light emitting area has a size greater than each of a size of the first light emitting area and a size of the second light emitting area, and the size of the first light emitting area is greater than the size of the second light emitting area.

In an embodiment of the present inventive concept, the display panel further includes an encapsulation layer disposed on the light emitting element.

In an embodiment of the present inventive concept, the input sensor is disposed directly on the encapsulation layer.

In an embodiment of the present inventive concept, the display device further includes an adhesive film disposed between the display panel and the input sensor.

According to an embodiment of the present inventive concept, a display device includes: a display panel configured to display an image and comprising a light emitting area and a non-light-emitting area, wherein a light emitting element is disposed in the light emitting area, and an input sensor disposed on the display panel and including a sensing electrode, wherein an opening in the sensing electrode at least partially exposes the light emitting area, and the sensing electrode includes a touch electrode overlapping the light emitting area and the non-light-emitting area.

In an embodiment of the present inventive concept, the light emitting element includes: a first light emitting element emitting a first light with a first wavelength band; a second light emitting element emitting a second light with a second wavelength band different from the first wavelength band; and a third light emitting element emitting a third light with a third wavelength band different from the first and second wavelength bands, and the light emitting area includes: a first light emitting area in which the first light emitting element is disposed; a second light emitting area in which the second light emitting element is disposed; and a third light emitting area in which the third light emitting element is disposed.

In an embodiment of the present inventive concept, the touch electrode includes: a first sensing portion overlapping at least one of the first, second, or third light emitting areas; and a second sensing portion connected to the first sensing portion and overlapping the non-light-emitting area.

In an embodiment of the present inventive concept, the touch electrode includes: a first portion overlapping the first light emitting area; a second portion overlapping the second light emitting area; and a third portion overlapping the third light emitting area.

In an embodiment of the present inventive concept, at least one of the first, second, or third portions has a width greater than a width of the remainder of the first, second, and third portions.

In an embodiment of the present inventive concept, the first light is a red light, the second light is a green light, and the third light is a blue light, and wherein the width of the third portion is greater than the width of each of the first and second portions, and the width of the first portion is greater than the width of the second portion.

In an embodiment of the present inventive concept, the third light emitting area has a size greater than each of a size of the first light emitting area and a size of the second light emitting area, and the size of the first light emitting area is greater than the size of the second light emitting area.

In an embodiment of the present inventive concept, the display panel further includes an encapsulation layer disposed on the light emitting element, and the input sensor is disposed on the encapsulation layer.

In an embodiment of the present inventive concept, the display device further includes an adhesive film disposed between the display panel and the input sensor.

BRIEF DESCRIPTION OF THE DRAWINGS

The above and other features of the present inventive concept will become more apparent by describing in detail embodiments thereof, with reference to the accompanying drawings in which.

DETAILED DESCRIPTION OF THE EMBODIMENTS

Figure 1:
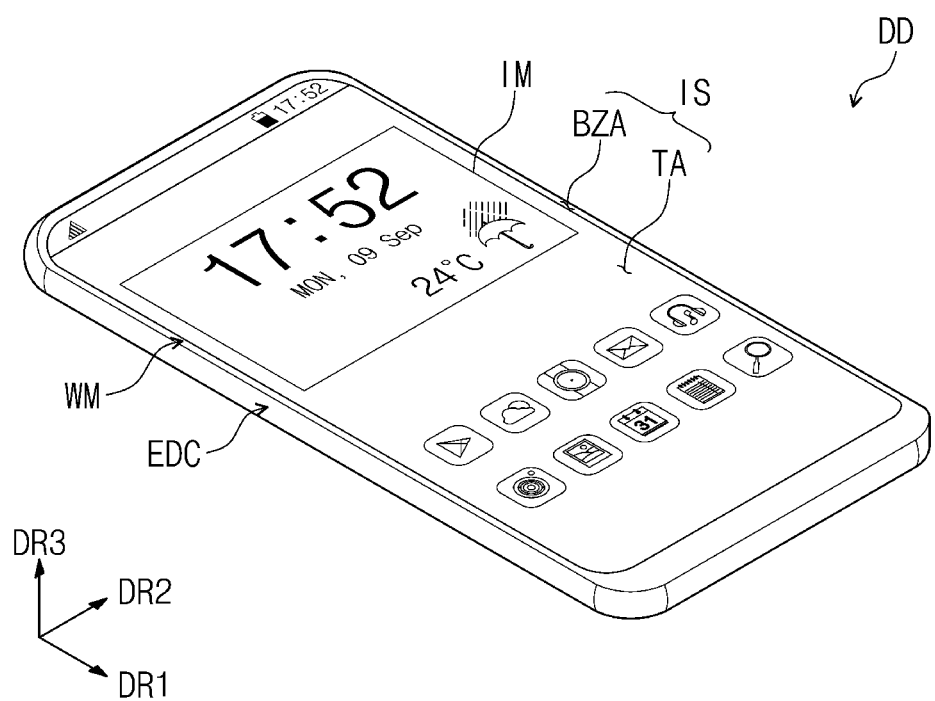
FIG. 1 is a perspective view showing a display device according to an embodiment of the present inventive concept.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout the specification. In the drawings, the thickness, ratio, and dimension of components may be exaggerated for clarity.

It will be understood that the term "and/or" includes any and all combinations of one or more of the associated listed items.

It will be understood that, although the terms first, second, etc. may be used herein to describe various elements, components, regions, layers and/or periods, these elements, components, regions, layers and/or periods should not be limited by these terms. These terms are only used to distinguish one element, component, region, layer or period from another region, layer or period. Thus, a first element, component, region, layer or period discussed below could be termed a second element, component, region, layer or period without departing from the scope of the present inventive concept. As used herein, the singular forms, "a", "an" and "the" are intended to include the plural forms as well, unless the context clearly indicates otherwise.

In addition, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

Hereinafter, embodiments of the present inventive concept will be described more fully with reference to the accompanying drawings.

Figure 2:
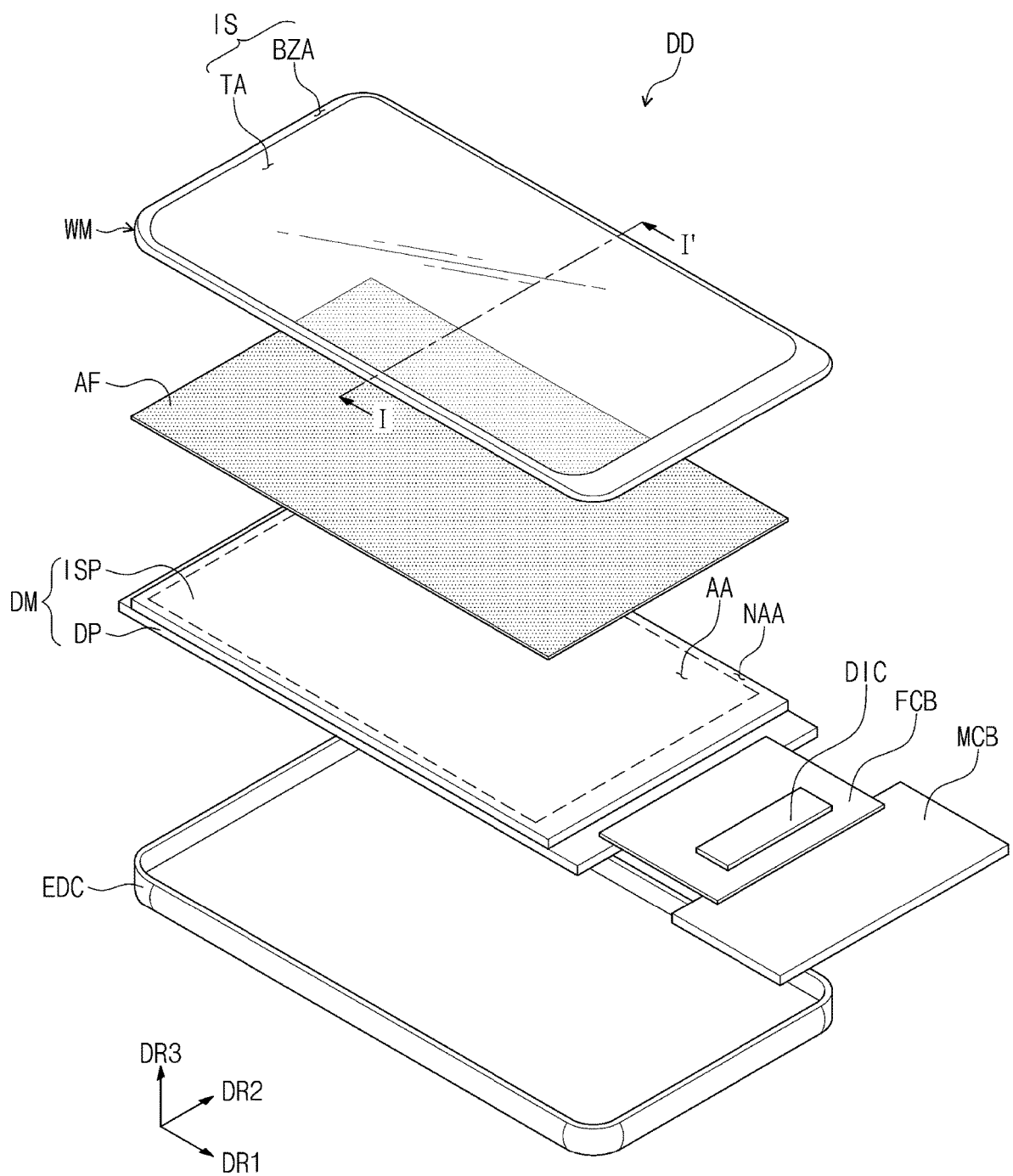
FIG. 2 is an exploded perspective view showing a display device according to an embodiment of the present inventive concept.
Figure 3:
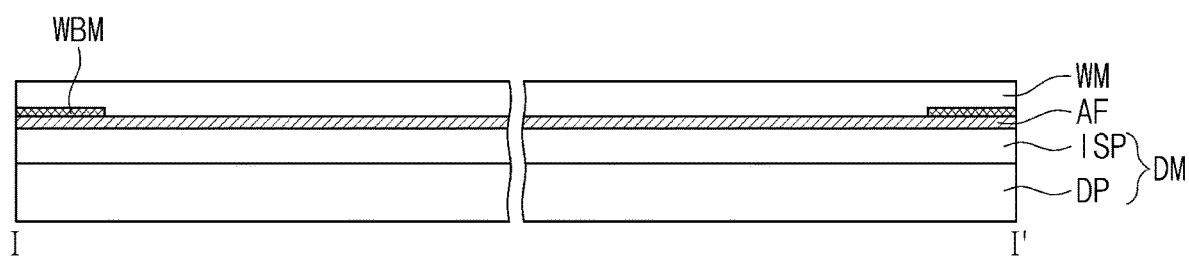
FIG. 3 is a cross-sectional view showing a display device taken along a line I-I' shown in FIG. 2.

FIG. 1 is a perspective view showing a display device DD according to an embodiment of the present inventive concept. FIG. 2 is an exploded perspective view showing the display device DD according to an embodiment of the present inventive concept. FIG. 3 is a cross-sectional view showing the display device taken along a line I-I' shown in FIG. 2.

Referring to FIGS. 1 to 3, the display device DD may be a device activated in response to electrical signals. The display device DD may be included in various electronic devices. For example, the display device DD may be applied to electronic devices, such as a smart watch, a tablet computer, a notebook computer, a computer, a smart television, or the like.

The display device DD may display an image IM toward a third direction DR3 through a display surface IS that is substantially parallel to each of a first direction DR1 and a second direction DR2. The display surface IS through which the image IM is displayed may correspond to a front surface of the display device DD. The image IM may include a video and/or a still image.

In the present embodiment, front (or, e.g., upper) and rear (or, e.g., lower) surfaces of each member of the display device DD are defined with respect to a direction in which the image IM is displayed. The front and rear surfaces are opposite to each other in the third direction DR3, and a normal line direction of each of the front and rear surfaces may be substantially parallel to the third direction DR3.

A separation distance in the third direction DR3 between the front surface and the rear surface may correspond to a thickness in the third direction DR3 of the display device DD. In addition, the first, second, and third directions DR1, DR2, and DR3 are relative to each other and may be changed in other directions.

The display device DD may sense an external input applied thereto from the outside. For example, the external input includes various forms of inputs provided from the outside of the display device DD, For example, the external inputs may include a proximity input (e.g., hovering) applied when a user's body (e.g., a finger) or a device (e.g., a stylus) comes within a predetermined distance of the display device DD. An additional example of an external input includes a touch input by a user's body (e.g., a user's hand). In addition, the external inputs may be provided in the form of force, pressure, temperature, light, etc.; however, the present inventive concept is not limited thereto.

The front surface of the display device DD may include a transmission area TA and a bezel area BZA. The transmission area TA may be an area through which the image IM is displayed. The user may view the image IM through the transmission area TA. In the present embodiment, the transmission area TA may have a quadrangular shape with rounded vertices, however, this is merely an example. The transmission area TA may have a variety of shapes and should not be particularly limited.

The bezel area BZA may be adjacent to the transmission area TA. The bezel area BZA may have a predetermined color. The bezel area BZA may surround the transmission area TA. Accordingly, the transmission area TA may have a shape defined by the bezel area BZA; however, this is merely an example, and the bezel area BZA may be disposed adjacent to only one side of the transmission area TA or may be omitted. The display device DD according to the embodiment of the present inventive concept may include various embodiments and should not be particularly limited.

As shown in FIGS. 2 and 3, the display device DD may include a display module DM, a window WM, and an adhesive film AF. The display module DM may include a display panel DP and an input sensor ISP.

The display panel DP according to the embodiment of the present inventive concept may be a light-emitting type display panel; however, the present inventive concept is not limited thereto. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

Referring to FIG. 3, the input sensor ISP may be disposed on the display panel DP. For example, the input sensor ISP may be disposed directly on the display panel DP. According to the embodiment of the present inventive concept, the input sensor ISP may be formed on the display panel DP through successive processes. For example, in the case where the input sensor ISP is disposed directly on the display panel DP, an inner adhesive film may not be disposed between the input sensor ISP and the display panel DP. However, according to an embodiment of the present inventive concept, the inner adhesive film may be disposed between the input sensor ISP and the display panel DP. In this case, the input sensor ISP is not manufactured together with the display panel DP through the successive processes. For example, the input sensor ISP may be fixed to an upper surface of the display panel DP by the inner adhesive film after being manufactured through a separate process from the display panel DP.

The display panel DP may generate the image, and the input sensor ISP may obtain coordinate information of the external input, e.g., a touch event.

The window WM may include a transparent material that transmits the image. For example, the window WM may include a glass, sapphire, or plastic material. The window WM may have a single-layer structure; however, the present inventive concept is not limited thereto, and the window WM may include a plurality of layers. In addition, the bezel area BZA of the display device DD may have a printing a material having a predetermined color on an area of the window WM. As an example, the window WM may include a light blocking pattern WBM to provide the bezel area BZA, The light blocking pattern WBM may be a colored organic layer and may be formed by a coating method.

The display module DM may be coupled to the window WM by the adhesive film AR As an example, the adhesive film AF may include an optically clear adhesive film (OCA). However, the adhesive film AF should not be limited thereto or thereby, and the adhesive film AF may include a different adhesive. For example, the adhesive film AF may include an optically clear resin (OCR) or a pressure sensitive adhesive film (PSA).

The display device DD may further include an anti-reflective unit. The anti-reflective unit may be disposed on the input sensor ISP. The anti-reflective unit may reduce a reflectance of an external light incident thereto from the above of the window WM. The anti-reflective unit according to the embodiment of the present inventive concept may include a retarder and/or a polarizer. The retarder may be a film type or liquid crystal coating type and may include a $\lambda/2$ retarder and/or a $\lambda/4$ retarder. For example, the polarizer may be a film type or liquid crystal coating type. For example, the film type polarizer may include a stretching type synthetic resin film, and the liquid crystal coating type polarizer may include liquid crystals aligned in a predetermined alignment. The retarder and the polarizer may be implemented as one polarizing film. The anti-reflective unit may further include a protective film disposed above or under the polarizing film.

The display module DM may display the image in response to electrical signals and may transmit/receive information based on the external input. The display module DM may include an active area AA and a peripheral area NAA. The active area AA may be an area through which the image provided from the display module DM transmits.

The peripheral area NAA may be adjacent to the active area AA. For example, the peripheral area NAA may at least partially surround the active area AA. However, this is merely an example, and the peripheral area NAA may be provided in various shapes and should not be particularly limited. According to an embodiment of the present inventive concept, the active area AA of the display module DM may correspond to at least a portion of the transmission area TA.

The display module DM may include a main circuit board MCB, a flexible circuit film FCB, and a driving chip DIC.

The main circuit board MCB may be connected to the flexible circuit film FCB and may be electrically connected to the display panel DP. The main circuit board MCB may include a plurality of driving elements. The driving elements may include a circuit to drive the display panel DP.

The flexible circuit film FCB may be connected to the display panel DP and may electrically connect the display panel DP to the main circuit board MCB. The driving chip DIC may be mounted on the flexible circuit film FCB.

The driving chip DIC may include driving elements, for example, a data driving circuit, to drive a pixel of the display panel DP. According to the embodiment of the present inventive concept, the display module DM includes one flexible circuit film FCB; however, the present inventive concept is not limited thereto or thereby. The flexible circuit film FCB may be provided in plural, and the flexible circuit films FCB may be connected to the display panel DP.

FIG. 2 shows a structure in which the driving chip DIC is mounted on the flexible circuit film FCB; however, the present inventive concept is not limited thereto or thereby. For example, the driving chip DIC may be disposed on the display parcel DP. As an additional example, the driving Chip DIC may be disposed directly on the display panel DP. In this case, a portion of the display panel DP on which the driving chip DIC is mounted may be bent to be disposed on a rear surface of the display module DM.

The input sensor ISP may be electrically connected to the main circuit board MCB through the flexible circuit film FCB; however, the embodiment of the present inventive concept is not limited thereto. For example, the display module DM may further include a separate flexible circuit film to electrically connect the input sensor ISP to the main circuit board MCB.

The display device DD may further include a sensor controller to control driving of the input sensor ISP. For example, the sensor controller may be built in the main circuit board MCB. However, as another example, the sensor controller may be built in the driving chip DIC. As an additional example, the sensor controller may be a circuit separate from the main circuit board MCB and the driving chip DIC.

The display device DD may further include an external case EDC accommodating the display module DM. The external case EDC may be coupled to the window WM and may provide an appearance of the display device DD. The external case EDC may absorb impacts applied thereto from the outside and may prevent foreign substance and moisture from entering the display module DM to protect components accommodated in the external case EDC. In addition, as an example, the external case EDC may be provided in a form in which a plurality of storage members is combined with each other.

The display device DD according to the embodiment of the present inventive concept may further include an electronic module or circuit including various functional modules or circuits to operate the display module DM, a power supply module or circuit supplying a power for an overall operation of the display device DD, and a bracket coupled to the display module DM and/or the external case EDC to divide an inner space of the display device DD.

Figure 4:
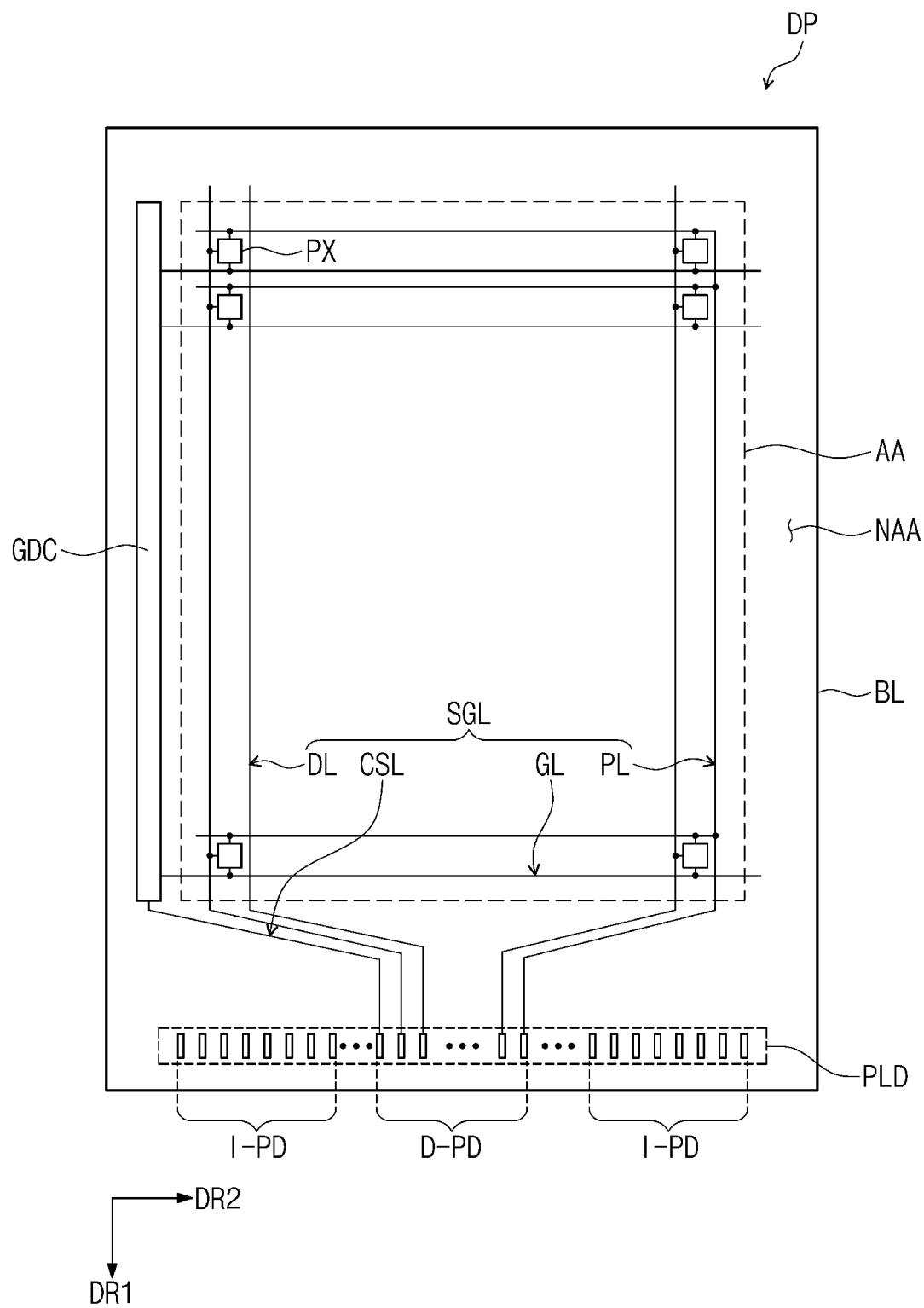
FIG. 4 is a plan view showing a display panel according to an embodiment of the present inventive concept.

FIG. 4 is a plan view showing the display panel DP according to an embodiment of the present inventive concept.

Referring to FIG. 4, the display panel DP may include a driving circuit GDC, a plurality of signal lines SGL, and a plurality of pixels PX. The display panel DP may include a pad part PLD disposed in the peripheral area NAA. The pad part PLD may include pixel pads D-PD each being connected to a corresponding signal line among the signal lines SGL.

The pixels PX may be arranged in the active area AA. Each of the pixels PX may include an organic light emitting diode and a pixel driving circuit connected to the organic light emitting diode. The driving circuit GDC, the signal lines SGL, the pad part PLD, and the pixel driving circuit may be included in a circuit dement layer DP-CL shown in FIG. 7A.

The driving circuit GDC may include a gate driving circuit. For example, the gate driving circuit may generate a plurality of gate signals and may sequentially output the gate signals to a plurality of gate lines GL described later. The gate driving circuit may further output other control signals to the pixel driving circuit.

The signal lines SGL may include the gate lines GL, data lines DL, a power line PL, and a control signal line CSL. Each of the gate lines GL may be connected to a corresponding pixel among the pixels PX, and each of the data lines DL may be connected to a corresponding pixel among the pixels PX, The power line PL may be connected to the pixels PX. The control signal line CSL may provide control signals to the driving circuit GDC. The signal lines SGL may overlap the active area AA and the peripheral area NAA.

The pad part PLD may be connected to the flexible circuit film PCB (refer to FIG. 2) and may include the pixel pads D-PD and input pads I-PD. The pixel pads D-PD may connect the flexible circuit film FCB to the display panel DP, and the input pads I-PD may connect the flexible circuit film PCB to the input sensor ISP (refer to FIG. 2). The pixel pads D-PD and the input pads I-PD may be provided by exposing a portion of lines disposed on the circuit element layer DP-CL without being covered by an insulating layer included in the circuit element layer DP-CL.

The pixel pads D-PD may be connected to corresponding pixels PX via the signal lines SGL. In addition, the driving circuit GDC may be connected to one pixel pad among the pixel pads D-PD.

Figure 5:
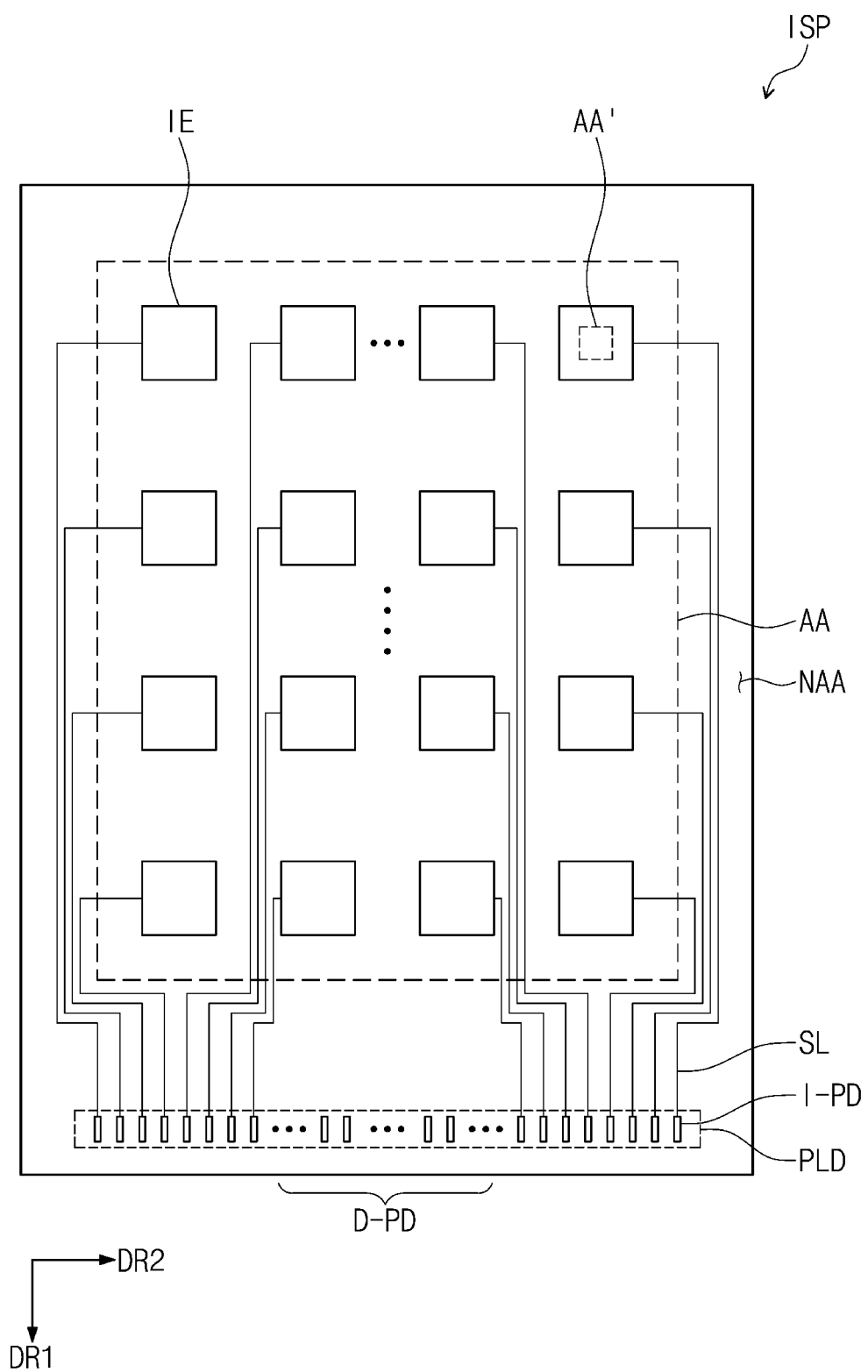
FIG. 5 is a plan view showing an input sensor according to an embodiment of the present inventive concept.

FIG. 5 is a plan view showing the input sensor ISP according to an embodiment of the present inventive concept. Referring to FIG. 5, the input sensor ISP may include a plurality of sensing electrodes IF and a plurality of trace lines SL. The sensing electrodes IE have their own coordinate information. The sensing electrodes IE may be arranged in the first and second directions DR1 and DR2. For instance, the sensing electrodes IE may be arranged in a matrix form and may each be connected to a trace line SL.

The input sensor ISP may include the input pads I-PD, each of Which may be connected to an end of a corresponding trace line SL of the plurality of trace lines SL and may be arranged in the peripheral area NAA.

The input sensor ISP according to the present embodiment may obtain coordinate information by, for example, a self-capacitance method. The sensing electrodes IE may be respectively connected to the input pads I-PD by the trace lines SL. Each of the sensing electrodes IE may be connected to the sensor controller via the input pads I-PD. The capacitance of each of the sensing electrodes IE may be changed by the external input, for example, the touch event. In the present embodiment, the sensitivity of input sensor ISP may be determined depending on a variation in capacitance. For example, as the variation in capacitance by the external input increases, the sensitivity of the input sensor ISP may be increased.

The shape and the arrangement of the sensing electrodes IE should not be limited. As an example, each of the sensing electrodes IE may have a polygonal shape, and the sensing electrodes IE each having a quadrangular shape are shown as a representative example. As an example, each of the sensing electrodes IE may include touch electrodes. The shape and the arrangement of the sensing electrodes IE may be changed depending on an arrangement of the touch electrodes according to an arrangement of the pixels PX (refer to FIG. 4) described later.

The sensing electrodes IE and the trace lines SL may be disposed in the active area AA. For example, a portion of each of the trace lines SL may be disposed in the active area AA, and the other portion of each of the trace lines SL may be disposed in the peripheral area NAA.

Figure 6:
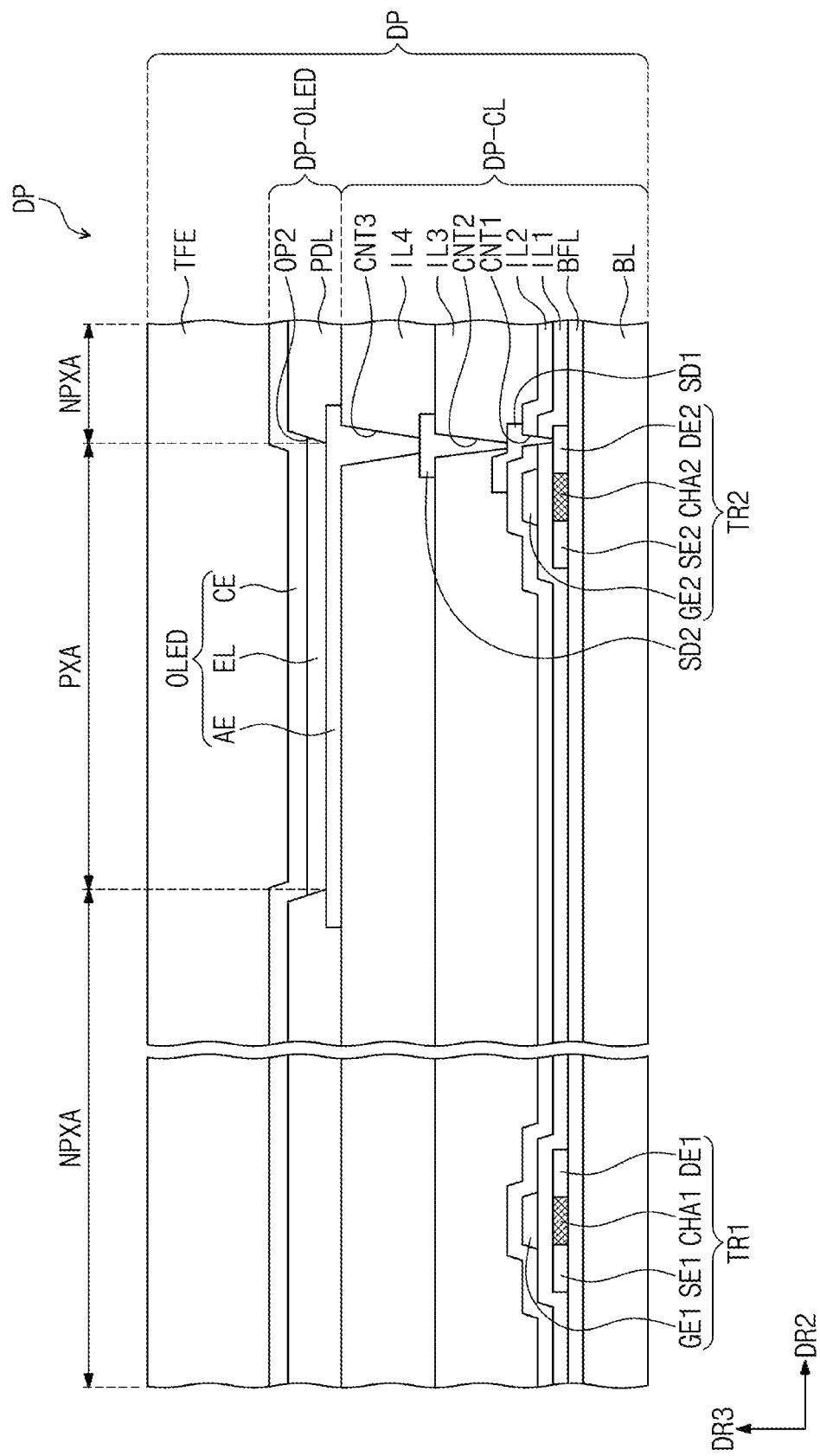
FIG. 6 is a cross-sectional view showing a display panel according to an embodiment of the present inventive concept.

FIG. 6 is a cross-sectional view showing the display panel DP according to an embodiment of the present inventive concept. Referring to FIG. 6, the display panel DP may include a plurality of intermediate insulating layers, semiconductor patterns, conductive patterns, and signal lines. The intermediate insulating layers, the semiconductor patterns, and the conductive patterns may be formed by a coating or depositing process. For example, the intermediate insulating layers, the semiconductor patterns, and the conductive patterns may be selectively patterned by a photolithography process. In this way, the semiconductor patterns, the conductive patterns, and the signal lines included in the circuit element layer DP-CL and a light emitting element layer DP-OLED may be formed.

The circuit element layer DP-CL may include a base layer BL, a buffer layer BFL, a first intermediate insulating layer IL1, a second intermediate insulating layer IL2, a third intermediate insulating layer IL3, and a fourth intermediate insulating layer IL4.

The base layer BL may include a synthetic resin film. For example, the synthetic resin film may include a heat-curable resin. The base layer BL may have a multi-layer structure. For instance, the base layer BL may have a three-layer structure of a synthetic resin layer, an adhesive layer, and a synthetic resin layer. For example, the synthetic resin layer may be a polyimide-based resin layer; however, the material for the synthetic resin layer may not be limited. The synthetic resin layer may include, for example, at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and/or a perylene-based resin. The base layer BL may include, for example, a glass substrate, a metal substrate, or an organic/inorganic composite substrate.

At least one inorganic layer may be formed on an upper surface of the base layer BL. For example, the inorganic layer may include at least one of aluminum oxide, titanium oxide, silicon oxide, silicon oxynitride, zirconium oxide, and/or hafnium oxide. The inorganic layer may be formed in multiple layers. The inorganic layers may form a barrier layer and/or a buffer layer. In the present embodiment, the display panel DP may include a buffer layer BFL.

The buffer layer BFL may increase an adhesion between the base layer BL and the semiconductor pattern. The buffer layer BFL may include, for example, a silicon oxide layer and a silicon nitride layer, and the silicon oxide layer and the silicon nitride layer may be alternately stacked with each other.

The semiconductor pattern may be disposed on the buffer layer BFL. The semiconductor pattern may include polysilicon; however, the present inventive concept is not limited thereto or thereby. For example, the semiconductor pattern may include amorphous silicon or metal oxide.

FIG. 6 shows only a portion of the semiconductor pattern, and the semiconductor pattern may be disposed in other areas of the pixel in a plane. The semiconductor pattern may be arranged over the pixels PX. The semiconductor pattern may have different electrical properties depending on whether it is doped or not and whether it is doped with an N-type dopant or a P-type dopant. The semiconductor pattern may include a first region and a second region. The first region may have a relatively high conductance, and the second region may have a relatively low conductance. For example, the first region may be doped with the N-type dopant or the P-type dopant. A P-type transistor may include a doped region doped with the P-type dopant. For example, the second region may be a non-doped region or may be doped at a concentration lower than that of the first region.

The first region may have a conductivity greater than that of the second region and may substantially serve as an electrode or signal line. The second region may substantially correspond to an active (or, e.g., a Channel) region of a transistor. For example, a portion of the semiconductor pattern may be the active region of the transistor. Another portion of the semiconductor pattern may be a source or a drain region of the transistor, and the other portion of the semiconductor pattern may be a connection electrode or a connection signal line.

As shown in FIG. 6, a first source region SE1, a first active region CHA1, and a first drain region DE1 of a first transistor TR1 may be formed from the semiconductor pattern, and a second source region SE2, a second active region CHA2, and a second drain region DE2 of a second transistor TR2 may be formed from the semiconductor pattern. The first source region SE1 and the first drain region DE1 may extend in opposite directions to each other from the first active region CHA1, and the second source region SE2 and the second drain region DE2 may extend in opposite directions to each other from the second active region CHA2. For example, the first active region CHA1 may be disposed between the first source region SE1 and the first drain region DE1, and the second active region CHA2 may be disposed between the second source region SE2 and the second drain region DE2.

The first intermediate insulating layer IL1 may be disposed on the buffer layer BFL. For example, the first intermediate insulating layer IL1 may commonly overlap the pixels PX and may cover the semiconductor pattern; however, the present inventive concept is not limited thereto, and for example, the first intermediate insulating layer IL1 may be divided into separate portions. The first intermediate insulating layer IL1 may be an inorganic layer and/or an organic layer and may have a single-layer or multi-layer structure. The first intermediate insulating layer HA may include at least one of aluminum oxide, titanium oxide, silicon oxide, oxynitride, zirconium oxide, and/or hafnium oxide. In the present embodiment, the first intermediate insulating layer IL1 may have, for example, a single-layer structure of a silicon oxide layer. Not only the first intermediate insulating layer IL1, but also an intermediate insulating layer of the circuit element layer DP-CL described later may be an inorganic layer and or an organic layer and may have a single-layer or multi-layer structure. The inorganic layer may include at least one of the above-mentioned materials.

First and second gates GE1 and GE2 may be disposed on the first intermediate insulating layer IL1. The first gate GE1 may correspond to a portion of metal pattern. The first and second gates GE1 and GE2 may overlap the first and second active regions CHA1 and CHA2, respectively. The first and second gates GE1 and GE2 may be used as a mask in a process of doping the semiconductor pattern.

The second intermediate insulating layer IL2 may be disposed on the first intermediate insulating layer IL1 and may cover the first and second gates GE1 and GE2. The second intermediate insulating layer IL2 may commonly overlap the pixels PX; however, the present inventive concept is not limited thereto, and for example, the second intermediate insulating layer IL2 may be divided into separate portions. The second intermediate insulating layer IL2 may be an inorganic layer and/or an organic layer and may have a single-layer or multi-layer structure. In the present embodiment, the second intermediate insulating layer IL2 may, for example, have a single-layer structure of silicon oxide layer.

A first connection electrode SD1 may be disposed on the second intermediate insulating layer IL2. The first connection electrode SD1 may be connected to the second drain DE2 via a first contact hole CNT-1 provided through the first intermediate insulating layer IL1 and the second intermediate insulating layer IL2.

The third intermediate insulating layer IL3 may be disposed on the second intermediate insulating layer IL2. The third intermediate insulating layer IL3 may be an organic layer. A second connection electrode SD2 may be disposed on the third intermediate insulating layer IL3. The second connection electrode SD2 may be connected to the first connection electrode SD1 through a second contact hole CNT-2 provided through the third intermediate insulating layer IL3.

The fourth intermediate insulating layer IL4 may be disposed on the third intermediate insulating layer IL3 and may cover the second connection electrode SD2. For example, the fourth intermediate insulating layer IL4 may be an organic layer.

The light emitting element layer DP-OLED may be disposed on the circuit element layer DP-CL. As an example, the light emitting element layer DP-OLED may include a light emitting element OLED and a pixel definition layer PDL.

The light emitting element OLED may include a first electrode AE, a light emitting layer EL, and a second electrode CE. The first electrode AE may be disposed on the circuit element layer DP-CL. The light emitting layer EL may be disposed on the first electrode AE, and the second electrode CE may be disposed on the light emitting layer EL.

The first electrode AE may be disposed on the fourth intermediate insulating layer IL4. The first electrode AE may be connected to the second connection electrode SD2 through a third contact hole CNT-3 provided through the fourth intermediate insulating layer IL4. An opening OP2 (hereinafter, referred to as a pixel opening) may be provided through the pixel definition layer PDL. At least a portion of the first electrode AE may be exposed through the pixel opening OP2 of the pixel definition layer PDL.

As shown in FIG. 6, the display panel DP may include a light emitting area PXA and a non-light-emitting area NPXA around the light emitting area PXA. The non-light-emitting area NPXA may at least partially surround the light emitting area PXA. In the present embodiment, the light emitting area PXA may correspond to the portion of the first electrode AE exposed through the pixel opening OP2.

The light emitting layer EL may be disposed on the first electrode AE. The light emitting layer EL may be disposed in an area corresponding to the pixel opening OP2. For example, the light emitting layer EL may be formed in each of the pixels PX (refer to FIG. 4) after being divided into plural portions.

The second electrode CE may be disposed on the light emitting layer EL. The second electrode CE may have an integral shape and may be commonly disposed over the pixels PX.

An encapsulation layer TFE may be disposed on the second electrode CE. The encapsulation layer TFE may be commonly disposed over the pixels PX. In the present embodiment, the encapsulation layer TEE may cover the second electrode CE. For example, the encapsulation layer TFE may be disposed directly on the second electrode CE. However, the present inventive concept is not limited thereto. In an embodiment of the present inventive concept, a capping layer may be disposed between the encapsulation layer TFE and the second electrode CE to cover the second electrode CE. In this case, the encapsulation layer TFE may cover the capping layer and may be directly disposed on the second electrode CE.

As an example, the light emitting element OLED may further include a hole control layer and an electron control layer. The hole control layer may be disposed between the first electrode AE and the light emitting layer EL and may further include a hole injection layer. The electron control layer may be disposed between the light emitting layer EL and the second electrode CE and may further include an electron injection layer. The hole control layer and the electron control layer may be commonly formed in the pixels PX using an open mask.

Figure 7A:
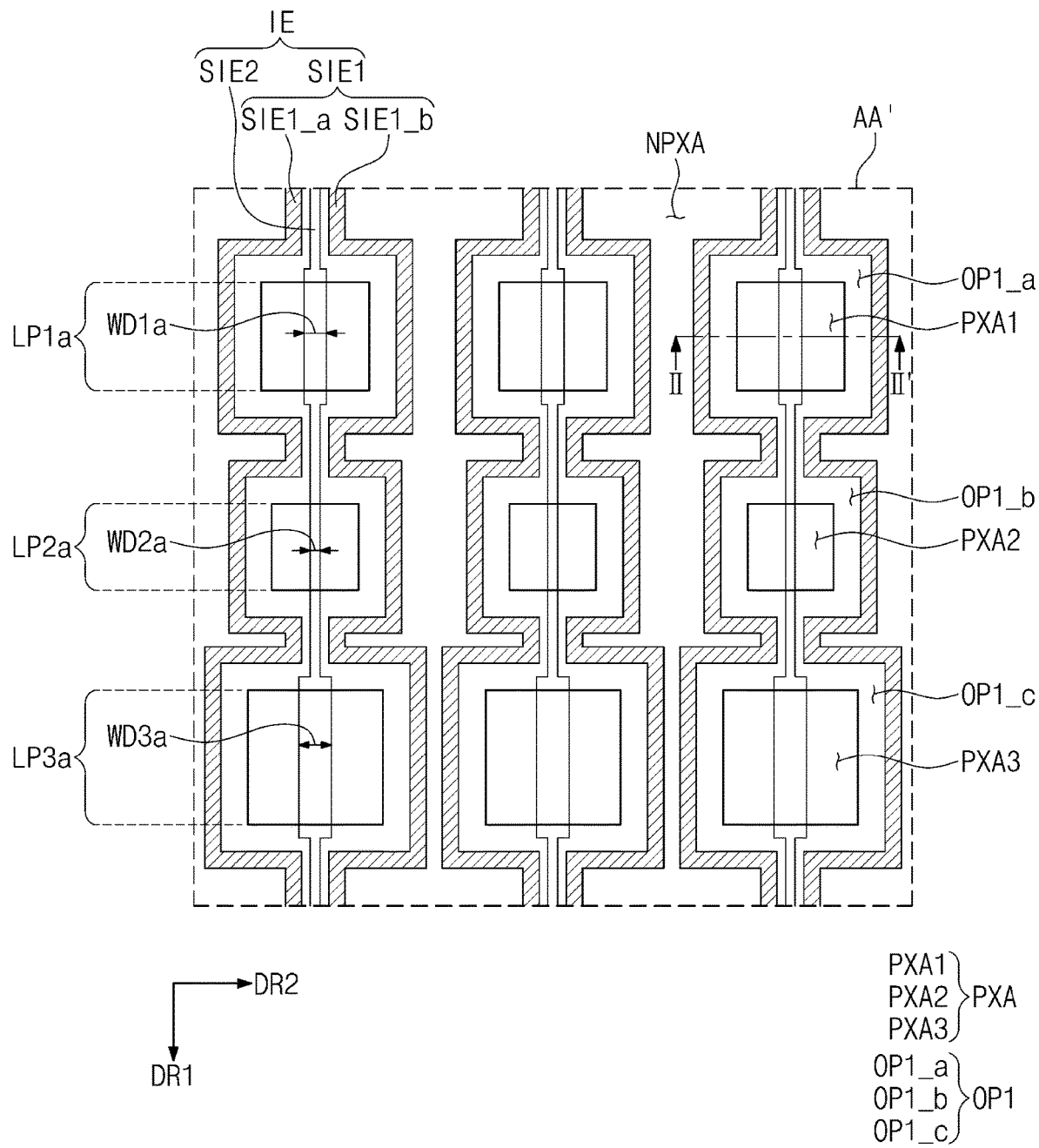
FIGS. 7A, 7B and 7C are enlarged plan views showing a portion of an input sensor corresponding to an area AA' of FIG. 5.
Figure 7B:
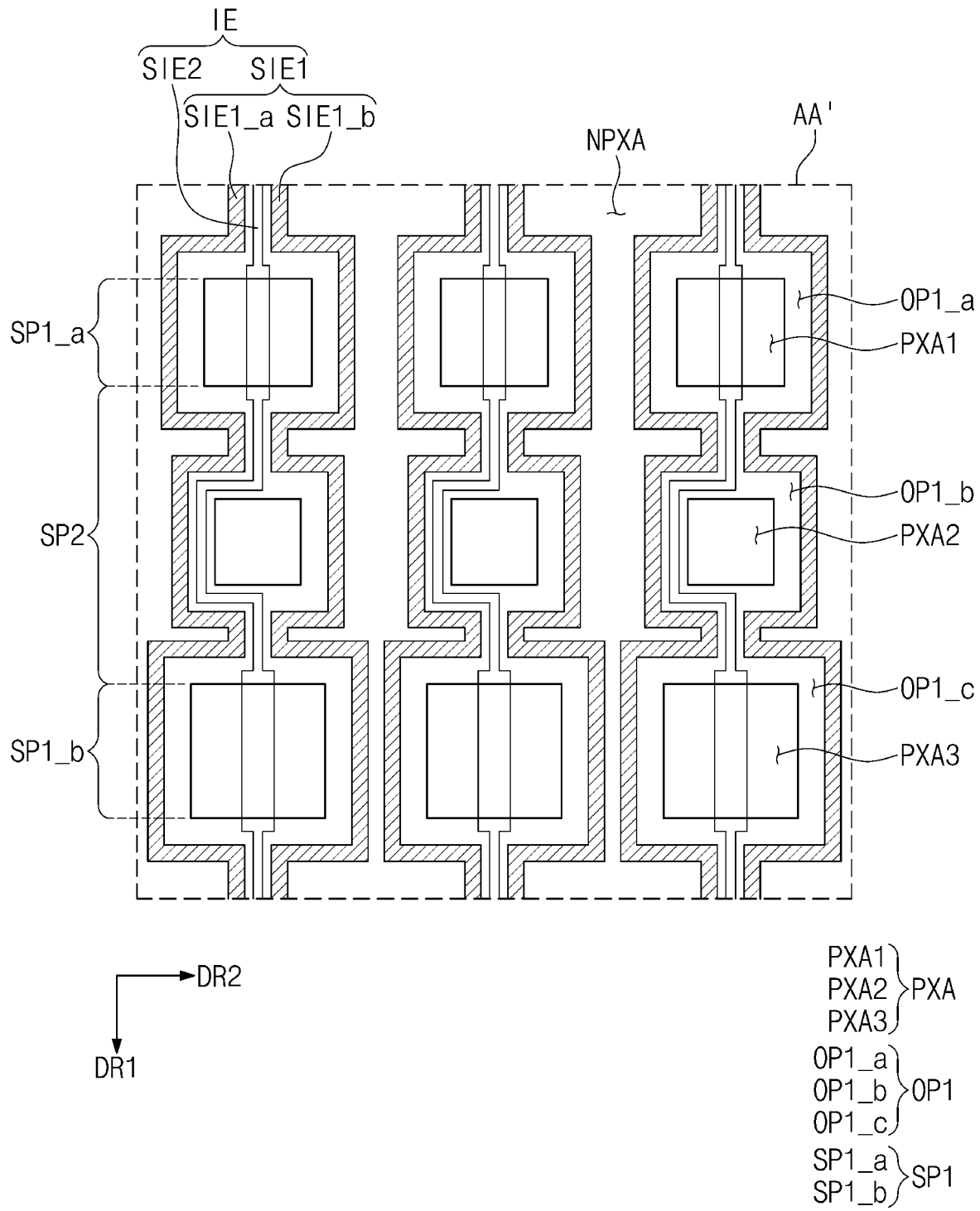
Figure 7C:
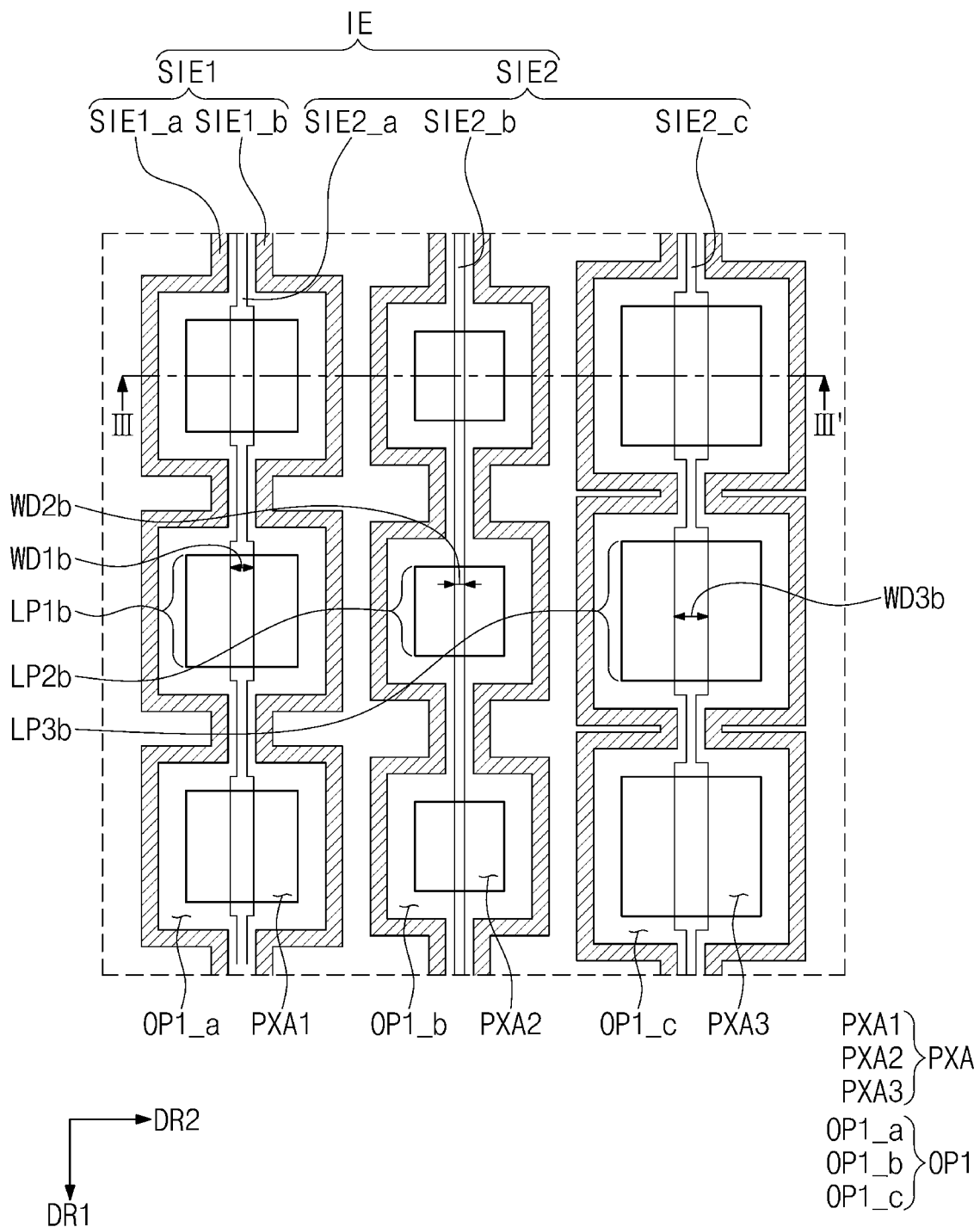

FIGS. 7A to 7C are enlarged plan views showing a portion of an input sensor corresponding to an area AA' of FIG. 5.

Referring to FIG. 7A, each of the sensing electrodes IE may include a plurality of first touch electrodes SIE1 and a plurality of second touch electrodes SIE2. The first touch electrodes SIE1 overlaps the non-light-emitting area NPXA. The second touch electrodes SIE2 overlaps the light emitting area PXA and the non-light-emitting area. NPXA and are electrically connected to the first touch electrodes SIE1. Each of the first and second touch electrodes SIE1 and SIE2 may include a metal material or transparent conductive material. The metal material may include, for example, silver, aluminum, copper, chromium, nickel, titanium, or the like, which may be processed at a low temperature; however, the present inventive concept is not limited thereto or thereby. The transparent conductive material may include a transparent conductive oxide, such as indium tin oxide (ITO), indium zinc oxide (IZO), zinc oxide (ZnO), indium zinc tin oxide (ITZO), or the like, in addition, the transparent conductive material may include a conductive polymer such as PEDOT, a metal nanowire, a graphene, or the like. In the case where the first and second touch electrodes SIE1 and SIE2 include the metal material that may be processed at the low temperature, the light emitting element OLED may be prevented from being damaged even though the input sensor ISP is formed through successive process.

The light emitting element OLED (refer to FIG. 6) may include a first light emitting element OLED1 (refer to FIG. 8B) emitting a first light in a first wavelength band, a second light emitting element OLED2 (refer to FIG. 8B) emitting a second light in a second wavelength band different from the first wavelength band, and a third light emitting element OLED3 (refer to FIG. 8B) emitting a third light in a third wavelength band different from the first and second wavelength bands. As an example, the first light may be a red light, the second light may be a green light, and the third light may be a blue light.

The light emitting area PXA may be divided into plural areas according to the light emitting element OLED disposed therein. The light emitting area PXA in which the first light emitting element OLED1 is disposed may be referred to as a first light emitting area PXA1. The light emitting area PXA in which the second light emitting element OLED2 is disposed may be referred to as a second light emitting area PXA2, and the light emitting area PXA in which the third light emitting element OLED3 is disposed may be referred to as a third light emitting area PXA3. Sizes of the first to third light emitting areas PXA1 to PXA3 may vary depending on a color of the lights generated by the first to third light emitting elements OLED1 to OLED3. The sizes of the first to third light emitting areas PXA1 to PXA3 may be determined depending on the type of the light emitting layer EL included in the light emitting element OLED. As an example, when the first, second, and third lights are respectively the red, green, and blue lights, the size of the third light emitting area PXA3 may be greater than the size of the first and second light emitting areas PXA1 and PXA2, and the size of the first light emitting area. PXA1 may be greater than the size of the second light emitting area PXA2. This is because an organic material emitting the red light has the best efficiency and an organic material emitting the blue light has the worst efficiency. In the present embodiment, the first to third light emitting areas PXA1 to PXA3 having different sizes are shown as a representative example; however, the present inventive concept is not limited thereto or thereby. For example, the first to third light emitting areas PXA1 to PXA3 may have the same size as each other.

The first touch electrodes SIE1 may extend in the first direction DR1, may be arranged in the second direction DR2, and may be disposed in the non-light-emitting area NPXA that surrounds the first to third light emitting areas PXA1 to PXA3. Each of the first touch electrodes S1E1 may include a first sub-touch electrode SIE1_a and a second sub-touch electrode SIE1_b, which extend in the first direction DR1, and are arranged in the second direction DR2. In addition, the first touch electrodes SIE1 may at least partially surround the light emitting areas PXA1 to PXA3. An opening OP1 (hereinafter, referred to as an electrode opening) may be provided between the first and second sub-touch electrodes SIE1_a and SIE1_b to at least partially expose the light emitting area PXA. A size of the electrode opening OP1 may vary depending on the first to third light emitting areas PXA1 to PXA3 surrounded by the first and second sub-touch electrodes SIE1_a and SIE1_b. As an example, when the first and second sub-touch electrodes SIE1_a and SIE1_b surround the first light emitting area PXA1, the electrode opening OP1 may be a first electrode opening OP1_a, When the first and second sub-touch electrodes SIE1_a and SIE1_b surround the second light emitting area PXA2, the electrode opening OP1 may be a second electrode opening OP1_b. When the first and second sub-touch electrodes SIE1_a and SIE1_b surround the third light emitting area PXA3, the electrode opening OP1 may be a third electrode opening OP1_c. In this case, for example, a size of the third electrode opening OP1_c may be greater than a size of the first and second electrode openings OP1_a and OP1_b, and the size of the first electrode opening OP1_a may be greater than the size of the second electrode opening OP1_b. In the present embodiment, the first to third electrode openings OP1_a to OP1_c having different sizes from each other are shown as a representative example; however, the present inventive concept is not limited thereto or thereby. For example, the first to third electrode openings OP1_a to OP1_c may have the same size as each other.

The second touch electrodes SIE2 may extend in the first direction DR1 and may be arranged in the second direction DR2. Each of the second touch electrodes SIE2 may overlap the light emitting area PXA and the non-light-emitting area NPXA. As an example, the first to third light emitting areas PXA1 to PXA3 are sequentially arranged in the first direction DR1 in the display panel DP (refer to FIG. 4), and the same type of light emitting areas may be arranged in the same row along the second direction DR2. For example, the first light emitting area PXA1 may be arranged in a first row, and the second light emitting area PXA2 may be arranged in a second row. As an additional example, the third light emitting area PXA3 may be arranged in a third row.

When compared with an example in which each of the sensing electrodes IE includes only the first touch electrodes SIE1 overlapping the non-light-emitting area NPXA, the number and the area of the first and second touch electrodes SIE1 and SIE2 included in one sensing electrode IE may increase in the case where each of the sensing electrodes IE includes the first touch electrodes SIE1 and the second touch electrodes SIE2 overlapping the light emitting area PXA. Accordingly, the sensitivity of the input sensor ISP may be increased. As an example, compared to a display device with a small screen such as a smart phone, a display device with a large screen, such as a television, has a large gap between pixels even though they have the same display resolution, Therefore, a gap between the first touch electrodes SIE1 may increase, the number of the first touch electrodes SIE1 included in the one sensing electrode IE may decrease, and as a result, the sensitivity of the input sensor ISP may be lowered. In this case, when each of the sensing electrodes IE further includes the second touch electrodes SIE2, the sensitivity of the input sensor ISP may be increased.

However, in the case where the second touch electrodes SIE2 include the metal material, the lights generated from the first to third light emitting areas PXA1 to PXA3 may be reflected by the second touch electrodes SIE2 and may not travel to the outside. In this case, since the first to third light emitting areas PXA1 to PXA3 have different sizes from each other and when the second touch electrodes SIE2 are disposed to overlap the first to third light emitting areas PXA1 to PXA3 with the same width, the amounts of the lights that do not travel to the outside may be different depending on the colors of the emitted lights, thereby affecting the user's visibility. According to the present inventive concept, the width of the second touch electrodes SIE2 may vary depending on the light emitting area overlapping therewith.

As an example, each of the second touch electrodes SIE2 may include a first portion LP1a overlapping the first light emitting area PXA1, a second portion LP2a overlapping the second light emitting area. PXA2, and a third portion LP3a overlapping the third light emitting area PXA3. At least one portion of the first to third portions LP1a to LP3a may have a width greater than the remaining portions. As an example, when the first, second, and third lights are the red, green, and blue lights, respectively, the size of the third light emitting area PXA3 corresponding to a blue light may be greater than the size of each of the first light emitting area PXA1 corresponding to a red light and the second light emitting area PXA2 corresponding to a green light, and the size of the first light emitting area PXA1 may be greater than the size of the second light emitting area PXA2. In this case, the third portion LP3a may have a width WD3a greater than each of a width WD1a of the first portion LP1a and a width WD2a of the second portion LP2a, and the width WD1a of the first portion LP1a may be greater than the width WD2a of the second portion LP2a. A rate of the light that does not travel to the outside due to the second touch electrodes SIE2 may be the same for each color by varying the width of each of the second touch electrodes SIE2 depending on the size of the overlapping light emitting area. Accordingly, although the second touch electrodes SIE2 are disposed to overlap the light emitting area PXA, it may not affect the users' visibility.

Referring to FIG. 7B, each of second touch electrodes SIE2 may include a first sensing portion SP1 and a second sensing portion SP2. The first sensing portion SP1 may overlap at least one light emitting area among first to third light emitting areas PXA1 to PXA3, and the second sensing portion SP2 may be connected to the first sensing portion SP1 and may overlap a non-light-emitting area NPXA. Hereinafter, detailed descriptions of the same elements as those of FIG. 7A will be omitted.

As an example, FIG. 7B shows a structure in Which each of the second touch electrodes SIE2 includes the first sensing portion SP1 that overlaps the first and third light emitting areas PXA1 and PXA3 and the second sensing portion SP2 that overlaps the non-light-emitting area NPXA and does not overlap the second light emitting area PXA2. The first sensing portion SP1 may include a first sub-sensing portion SP1_a and a second sub-sensing portion SP2. The first sensing portion SP1 may overlap the first light emitting area PXA1, and the second sub-sensing portion SP1_b may overlap the third light emitting area PXA3. In the embodiment of the present inventive concept, a size of the second light emitting area PXA2 is the smallest, and thus, the effect on the user's visibility is the greatest when the second touch electrodes SIE2 overlap the second light emitting area PXA2. Accordingly, the second touch electrodes SIE2 may be disposed not to overlap the second light emitting area PXA2. However, the present inventive concept is not limited thereto or thereby. Each of the second touch electrodes SIE2 may not overlap the first light emitting area PXA1. In addition, the first sensing portion SP1 may have a width that varies depending on the light emitting areas overlapping therewith. The second sensing portion SP2 may be disposed in the non-light-emitting area. NPXA and may be spaced apart from each of the first touch electrodes SIE1.

Referring to FIG. 7C, as an example, first to third light emitting areas PXA1 to PXA3 may be sequentially arranged in the second direction DR2 in the display panel DP, and the same type of the light emitting areas may be arranged in the same column along the first direction DR1. Hereinafter, detailed descriptions of the same elements as those of FIG. 7A will be omitted.

Each of second touch electrodes SIE2 may include a third sub-touch electrode SIE2_a, a fourth sub-touch electrode SIE2_b, and a fifth sub-touch electrode SIE2_c, which extend in the first direction DR1. The third sub-touch electrode SIE2_a may overlap the first light emitting area PXA1. The fourth sub-touch electrode SIE2_b may overlap the second light emitting area PXA2, and the fifth sub-touch electrode SIE2_c may overlap the third light emitting area PXA3.

The third sub-touch electrode SIE2_a may include a plurality of first portions LP1b, and the fourth sub-touch electrode SIE2_b may include a plurality of second portions LP2b. The fifth sub-touch electrode SIE2_c may include a plurality of third portions LP3b.

However, the first to third light emitting areas PXA1 to PXA3 may be arranged in the display panel DP of the present inventive concept in various ways without being limited to the embodiments shown in FIGS. 7A to 7C. As an example, the first to third light emitting areas may be arranged in the same arrangement manner as light emitting areas as shown in FIGS. 9, 10A, and 10B.

Figure 8A:
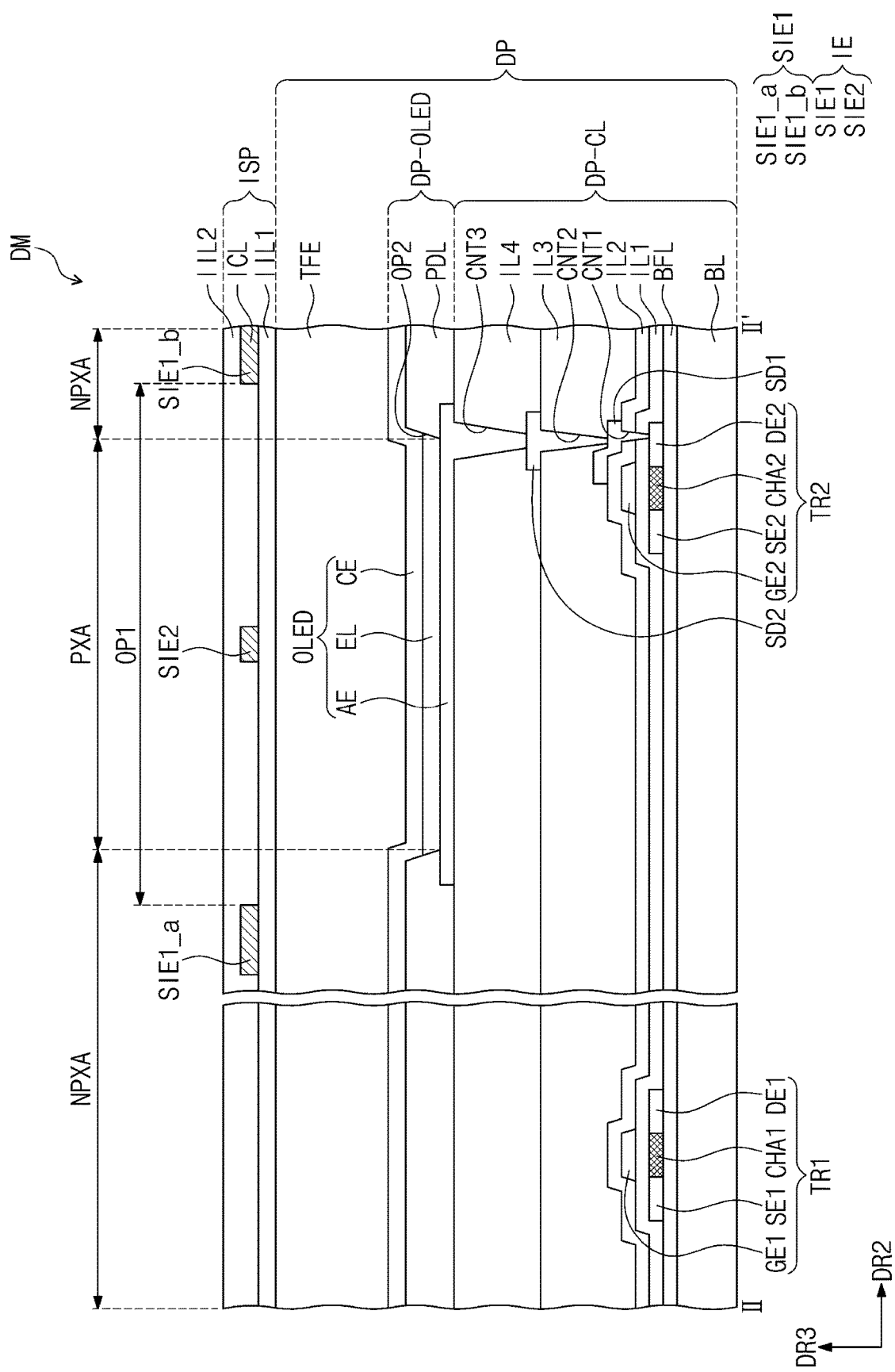
FIG. 8A is a cross-sectional view taken along a line II-II' of FIG. 7A to show a display module.
Figure 8B:
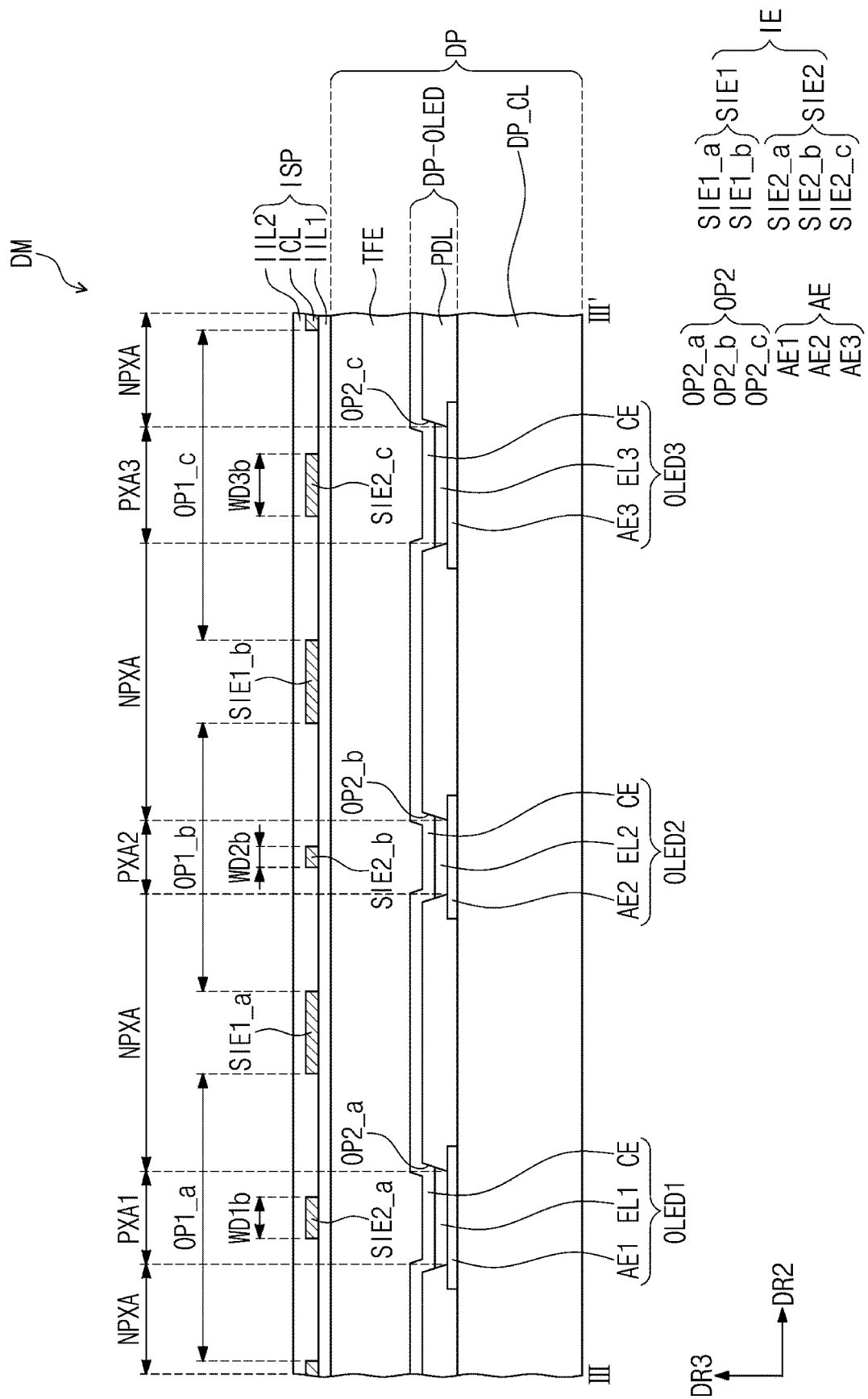
FIG. 8B is a cross-sectional view taken along a line III-III' of FIG. 7C to show a display module.

FIG. 8A is a cross-sectional view taken along a line II-II' shown in FIG. 7A to show the display module DM, and FIG. 8B is a cross-sectional view taken along a line shown in FIG. 7C to show a display module.

Referring to FIG. 8A, the display module DM may include the display panel DP and the input sensor ISP disposed on the display panel DP, For example, the input sensor ISP may be disposed directly on the display panel DP. Hereinafter, detailed descriptions of the same elements as those described with reference to FIG. 6 will be omitted.

The input sensor ISP may be formed on the display panel DP through successive processes. The input sensor ISP may include a first sensing insulating layer IIL1, a conductive layer ICL, and a second sensing insulating layer IIL2.

The first sensing insulating layer IIL1 may be an inorganic layer including one of silicon nitride, silicon oxynitride, and/or silicon oxide. As another way, the first sensing insulating layer IIL1 may include an organic layer including an epoxy-based resin, an acrylic-based resin, or an imide-based resin. The first sensing insulating layer IIL1 may have a single-layer structure or a multi-layer structure of layers stacked in the third direction DR3.

The conductive layer ICL may be disposed on the first sensing insulating layer IIL1. As an example, the conductive layer ICL may include sensing electrodes IL. The conductive layer ICL, may be covered by the second sensing insulating layer IIL2.

The conductive layer ICL, may have a single-layer structure or a multi-layer structure of layers stacked in the third direction DR3. The conductive layer ICL having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include a conductive polymer such as PEDOT, a metal nanowire, a graphene, or the like.

The conductive layer ICL having the multi-layer structure may include metal layers. The metal layers may have a three-layer structure of titanium/aluminum/titanium. The conductive layer ICL having the multi-layer structure may include at least one metal layer and at least one transparent conductive layer.

The second sensing insulating layer IIL2 may include an inorganic layer. The inorganic layer may include at least one of aluminum oxide, titanium oxide, silicon oxide, silicon oxynitride, zirconium oxide, and/or hafnium oxide. The second sensing insulating layer IIL2 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

The electrode opening OP1 may have a width in the second direction DR2 that is substantially equal to the distance between the first sub-touch electrode SIE1_a and the second sub-touch electrode SIE1_b.

Referring to FIG. 8B, the pixel opening OP2 may include a first pixel opening OP2_a, a second pixel opening OP2_b, and a third pixel opening OP2_c. In the first pixel opening OP2_a, at least a portion of a first electrode AE1 of the first light emitting element OLED1 is exposed. In the second pixel opening OP2_b, at least a portion of a first electrode AE2 of the second light emitting element OLED2 is exposed. In the third pixel opening OP2_c at least a portion of a first electrode AE3 of the third light emitting element OLED3 is exposed. Hereinafter, detailed descriptions of the same elements as those described with reference to FIG. 6 will be omitted.

The first to third pixel openings OP2_a to OP2_c may have different sizes from each other. As an example, when first, second, and third lights are respectively red, green, and blue lights, a size of the third pixel opening OP2_c is greater than each of a size of the first pixel opening OP2_a and a size of the second pixel opening OP2_b, and the size of the first pixel opening OP2_a may be greater than the size of the second pixel opening OP2_b, The first to third light emitting areas PXA1 to PXA3, which correspond to the portions of the first electrodes AE1 to AE3 exposed through the first to third pixel opening OP2_a to OP2_c, may have different sizes from each other. As an example, when first, second, and third lights are respectively red, green, and blue lights, a size of the third light emitting area PXA3 corresponding to the blue light may be greater than each of a size of the first light emitting area PXA1 corresponding to the red light and a size of the second light emitting area PXA2 corresponding to the green light, and the size of the first light emitting area PXA1 may be greater than the size of the second light emitting area PXA2.

The third, fourth, and fifth sub-touch electrodes SIE2_a and SIE2_c may have different widths from each other. For example, the third sub-touch electrode SIE2_a may overlap the first light emitting area PXA1. As an additional example, the fourth sub-touch electrode SIE2_b may overlap the second light emitting area PXA2, and the fifth sub-touch electrode SIE2_c may overlap the third light emitting area PXA3. A width WD3b of the fifth sub-touch electrode SIE2_c may be greater than each of a width WD1b of the third sub-touch electrode SIE2_a and a width WD2b of the fourth sub-touch electrode SIE2_b. The width WD1b of the third sub-touch electrode SIE2_a may be greater than the width WD2b of the fourth sub-touch electrode SIE2_b. As an example, the width WD1b of the third sub-touch electrode SIE2_a may be a width WD1b of each of the first portions LP1b (refer to 7C) included in the third sub-touch electrode SIE2_a. The width WD2b of the fourth sub-touch electrode SIE2_b may be a width WD2b of each of the second portions LP2b (refer to 7C) included in the fourth sub-touch electrode SIE2_b, and the width WD3b of the fifth sub-touch electrode SIE2_c may be a width WD3b of each of the third portions LP3b (refer to 7C) included in the fifth sub-touch electrode SIE2_c.

FIGS. 9A to 10B are enlarged plan views showing a portion of an input sensor corresponding to an area AA' of FIG. 5.

Figure 9A:
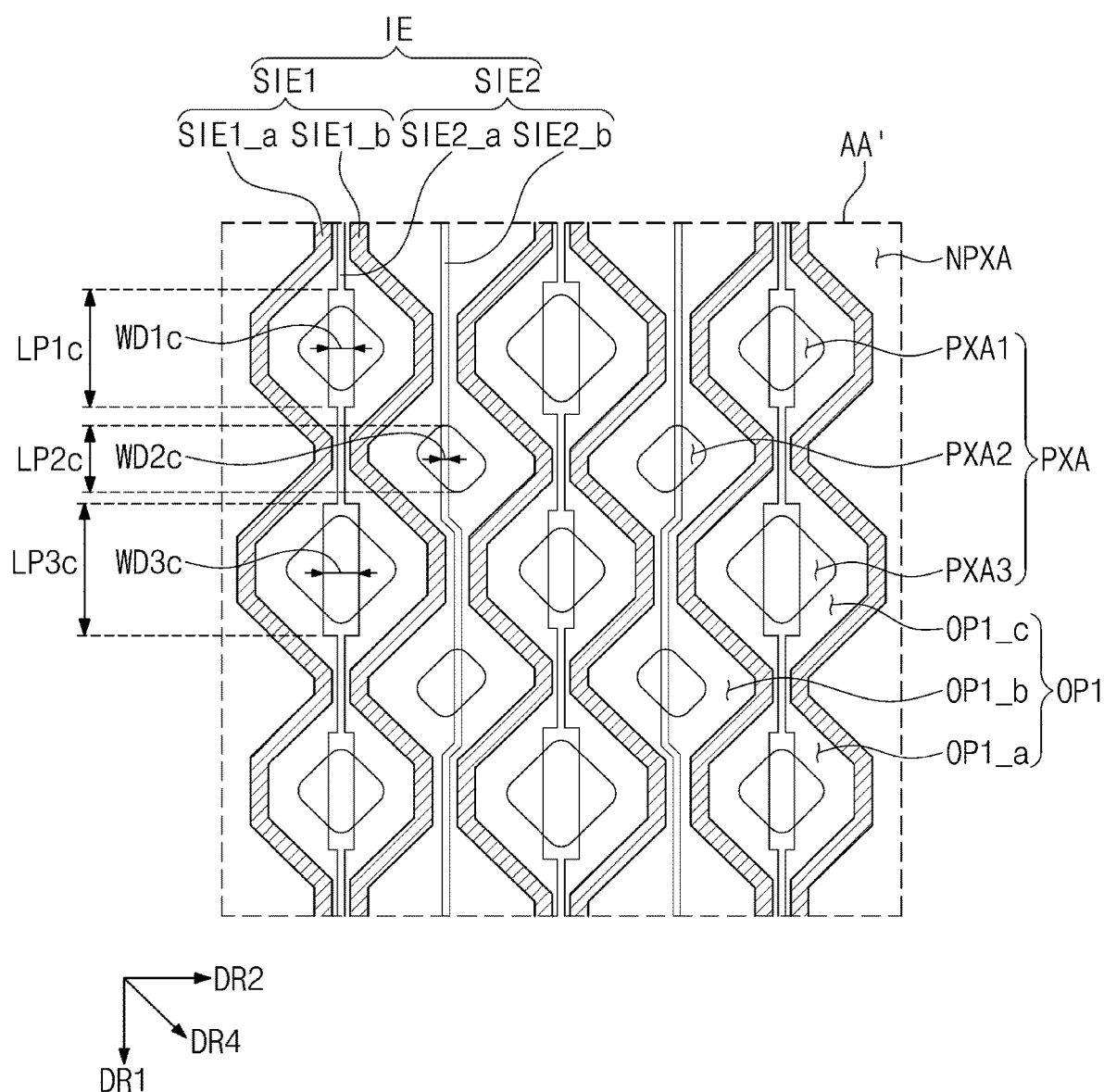
FIGS. 9A, 9B, 10A, and 10B are enlarged plan views showing a portion of an input sensor corresponding to an area AA' of FIG. 5.
Figure 10A:
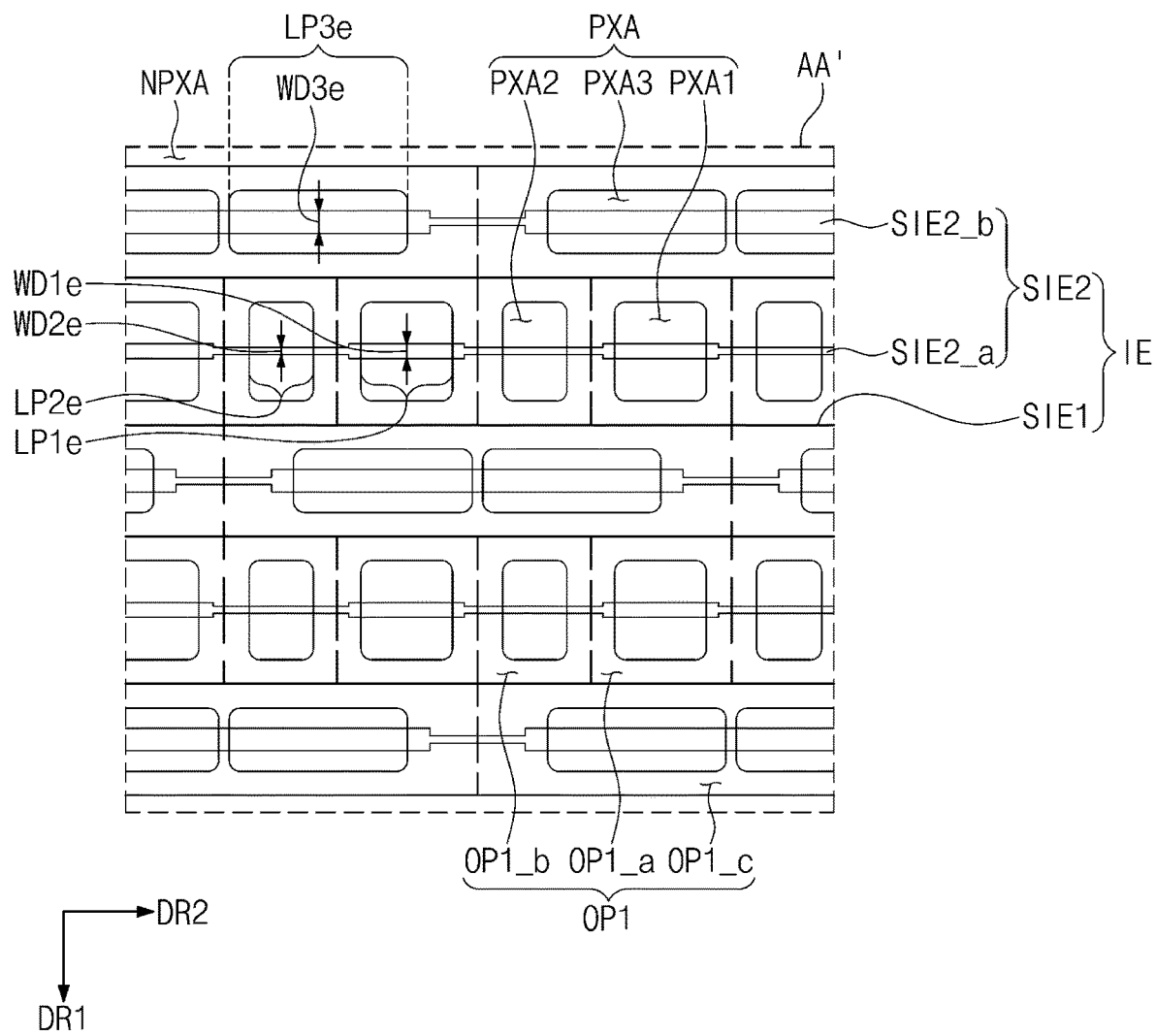
Figure 10B:
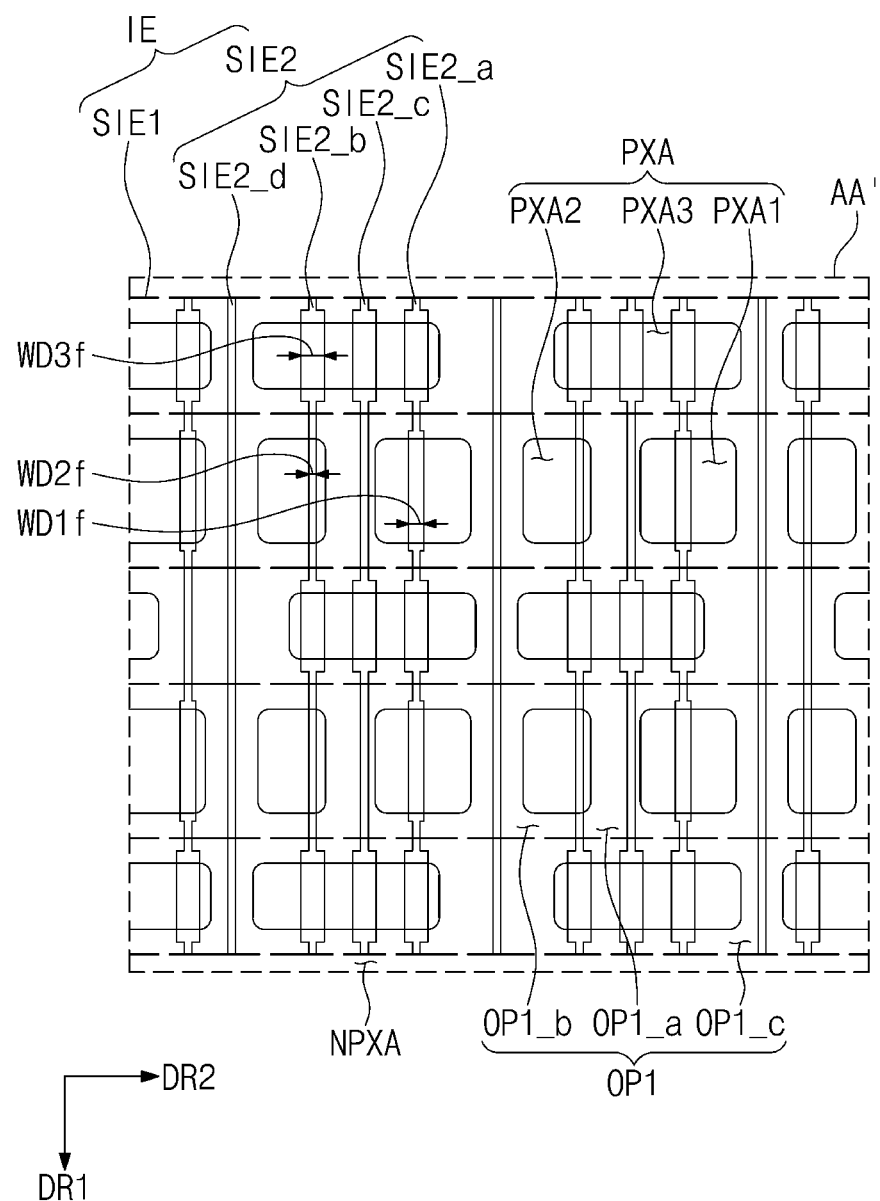

Referring to FIG. 9A, first and third light emitting areas PXA1 and PXA3 may be sequentially arranged in the first direction DR1 and the second direction DR2 in the display panel DP (refer to FIG. 4), and second light emitting area PXA2 may be arranged to be spaced apart from the first and third light emitting areas PXA1 and PXA3 in a fourth direction DR4 crossing the first direction DR1 and second direction DR2. Hereinafter, detailed descriptions of the same elements as those described with reference to FIGS. 7A to 7C will be omitted.

Each of second touch electrodes SIE2 may include a third sub-touch electrode SIE2_a and a fourth sub-touch electrode SIE2_b. The third sub-touch electrode SIE2_a may overlap the first and third light emitting areas PXA1 and PXA3 and a non-light-emitting area NPXA. The fourth sub-touch electrode SIE2_b may overlap the second light emitting area PXA2 and the non-light-emitting area NPXA. The fourth sub-touch electrode SIE2_b may be disposed in a direction different from the first direction DR1 to be spaced apart from first touch electrodes SIE1 in the non-light-emitting area NPXA. For example, a space may be between the fourth sub-touch electrode SIE2_b and the first touch electrode SIE1 in the second direction DR2.

Figure 9B:
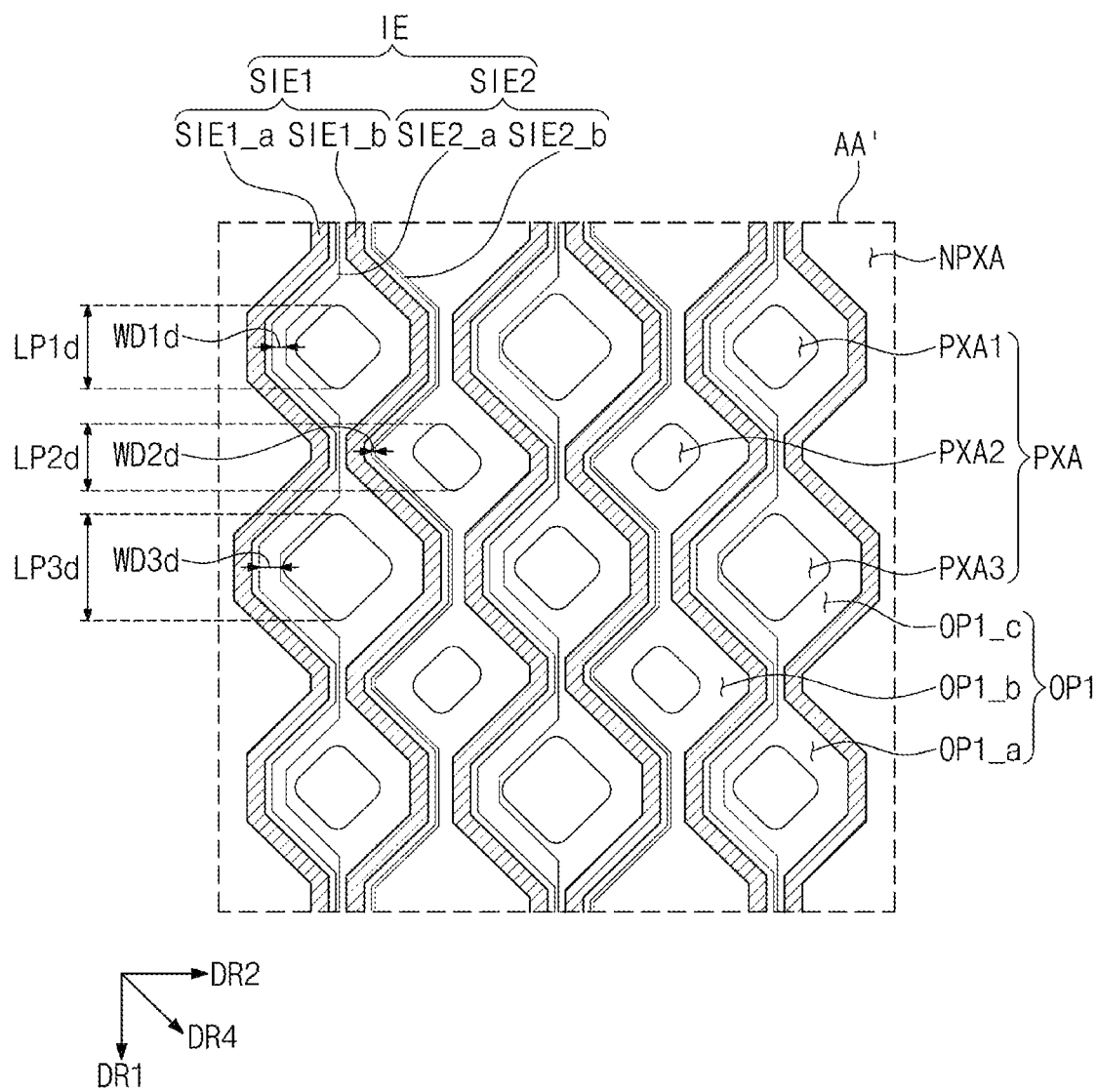

Referring to FIG. 9B, each of second touch electrodes SIE2 including third and fourth sub-touch electrodes SIE2_a and SIE2_b may not overlap first to third light emitting areas PXA1 to PXA3. The second touch electrodes SIE2 may be disposed between first and second sub-electrodes SIE1_a and SIE1_b adjacent to each other, and the second electrodes SIE2 may be disposed not to overlap the first to third light emitting areas PXA1 to PXA3. For example, the third sub-touch electrodes SIE2_a of the second touch electrodes SIE2 may be disposed between first and second sub-electrodes SIE1_a and SIE1_b of the first touch electrodes SIE1. Accordingly, as the second touch electrodes SIE2 are further disposed in each of sensing electrodes IE, the sensitivity of the input sensor ISP may be increased, and the user's visibility may be prevented from being affected by the second touch electrodes SIE2.

Referring to FIGS. 10A and 10E, first and second light emitting areas PXA1 and PXA2 may be arranged in the second direction DR2 in the display panel DP (refer to FIG. 6), and third light emitting area PXA3 may be spaced apart from the first and second light emitting areas PXA1 and PXA2 in the first direction DR1 and may be arranged in the second direction DR2. For example, the first and second light emitting areas PXA1 and PXA2 may be sequentially arranged in the second direction DR2; however, the present inventive concept is not limited thereto. Hereinafter, detailed descriptions of the same elements as those described with reference to FIGS. 7A to 7C will be omitted.

Referring to FIG. 10A, first touch electrodes SIE1 may be arranged in a non-light-emitting area NPXA along the first and second directions DR1 and DR2. Second touch electrodes SIE2 may include a third sub-touch electrode SIE2_a and a fourth sub-touch electrode SIE2_b and may be arranged in the first direction DR1. For example, the third sub-touch electrode SIE2_a and the fourth sub-touch electrodes SIE2_b may each extend in the second direction DR2. The third sub-touch electrode SIE2_a may overlap the first and second light emitting areas PXA1 and PXA2 and the non-light-emitting area NPXA. The fourth sub-touch electrode SIE2_b may overlap the third light emitting area PXA3 and the non-light-emitting area NPXA.

Referring to 10B, first touch electrodes SIE1 may be disposed in a non-light-emitting area NPXA along the first and second directions DR1 and DR2. Second touch electrodes SIE2 may include third, fourth, fifth, and sixth sub-touch electrodes SIE2_a, SIE2_b, SIE2_c, and SIE2_d and may be arranged in the second direction DR2. For example, the third, fourth, fifth, and sixth sub-touch electrodes SIE2_a, SIE2_b, SIE2_c, and SIE2_d may extend in the first direction DR1. The third sub-touch electrode SIE2_a may overlap first and third light emitting areas PXA1 and PXA3 and the non-light-emitting area NPXA. The fourth sub-touch electrode SIE2_b may overlap second and third light emitting areas PXA2 and PXA3 and the non-light-emitting area NPXA. The fifth sub-touch electrode SIE2_c may overlap the third light emitting area PXA3 and the non-light-emitting area NPXA. The sixth sub-touch electrode SIE2_d may not overlap the first to third light emitting areas PXA1 to PXA3 and may overlap the non-light-emitting area NPXA.

Referring to FIGS. 10A and 10C, the first touch electrodes SIE1 may include a plurality of electrodes electrically connected to each other by the second touch electrodes SIE2 rather than being configured as one electrode. When the first touch electrodes SIE1 include the plurality of electrodes, a level of a parasitic capacitance occurring between the first touch electrodes SIE1 and the electrodes of the display panel DP may be reduced. In addition, when the first touch electrodes SIE1 include a metal material, the first touch electrodes SIE1 may be viewed from the outside even though the first touch electrodes SIE1 are disposed in the non-light-emitting area NPXA. Accordingly, when the first touch electrodes SIE1 are formed of the plurality of electrodes electrically connected to each other rather than one electrode, the first touch electrodes SIE1 may be prevented from being viewed from the outside.

Figure 11:
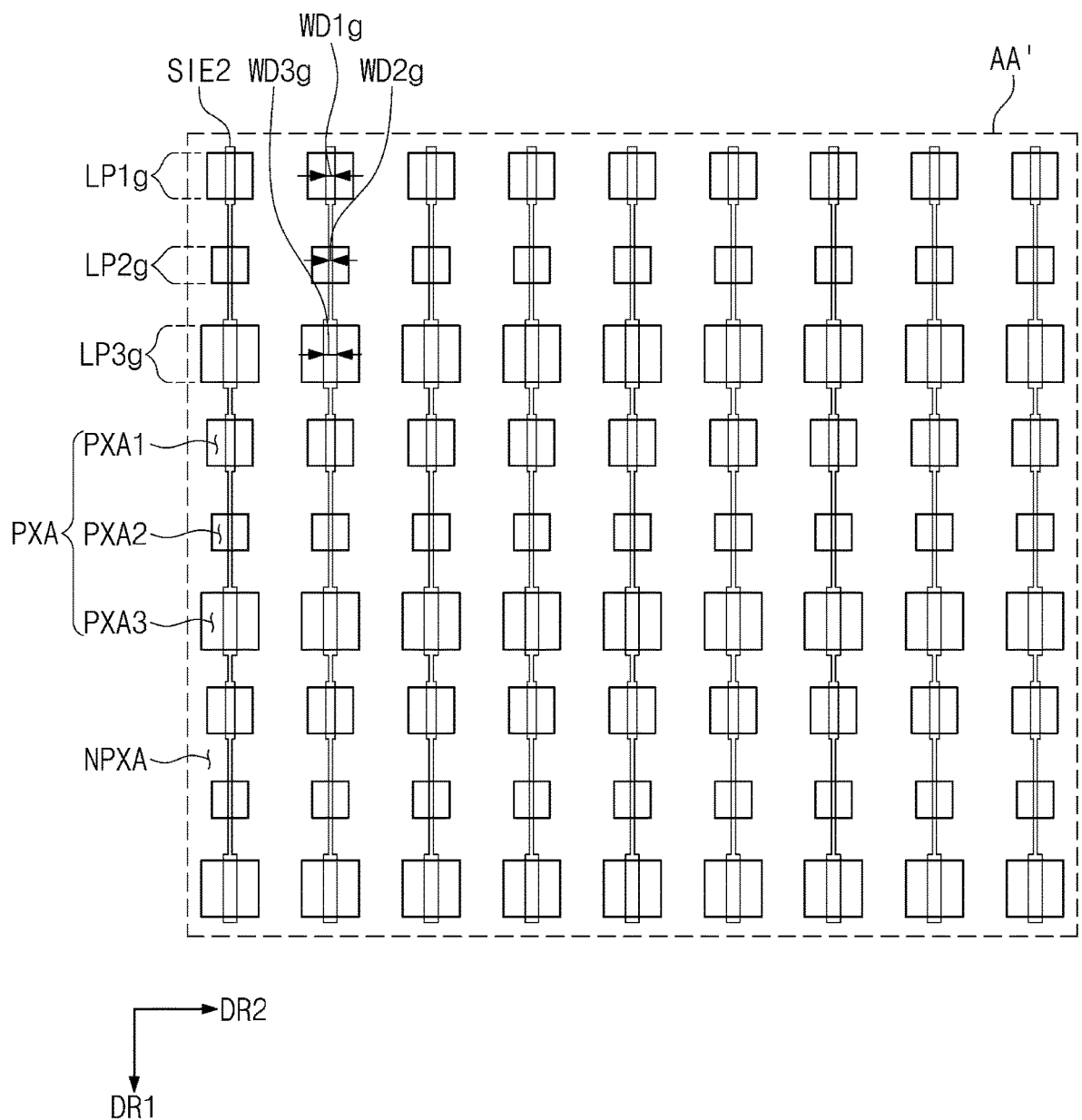
FIG. 11 is an enlarged plan view showing a portion of an input sensor corresponding to an area AA' of FIG. 5.

FIG. 11 is an enlarged plan view showing a portion of an input sensor corresponding to an area AA' of FIG. 5. Hereinafter, detailed descriptions of the same elements as those described with reference to FIG. 7A will be omitted.

Referring to FIGS. 4 and 11, when the resolution of the display panel DP increases, the number of pixels PX included in a unit area may increase, and the size of the non-light-emitting area NPXA surrounding the light emitting area PXA may decrease. Accordingly, difficulties may arise in the process of placing the first touch electrodes SIE1 in the non-light-emitting area NPXA or in separating the first touch electrodes SIE1 from each other as shown in FIG. 7A. In this case, each of the sensing electrodes (refer to FIG. 5) may not include the first touch electrodes SIE1 but may include the second touch electrodes SIE2 overlapping the light emitting area PXA and the non-light-emitting area NPXA. The second touch electrodes SIE2 may be disposed to overlap the light emitting area PXA, and thus, difficulties may not arise in the manufacturing process even though the resolution of the display panel DP increases.

Figure 12:
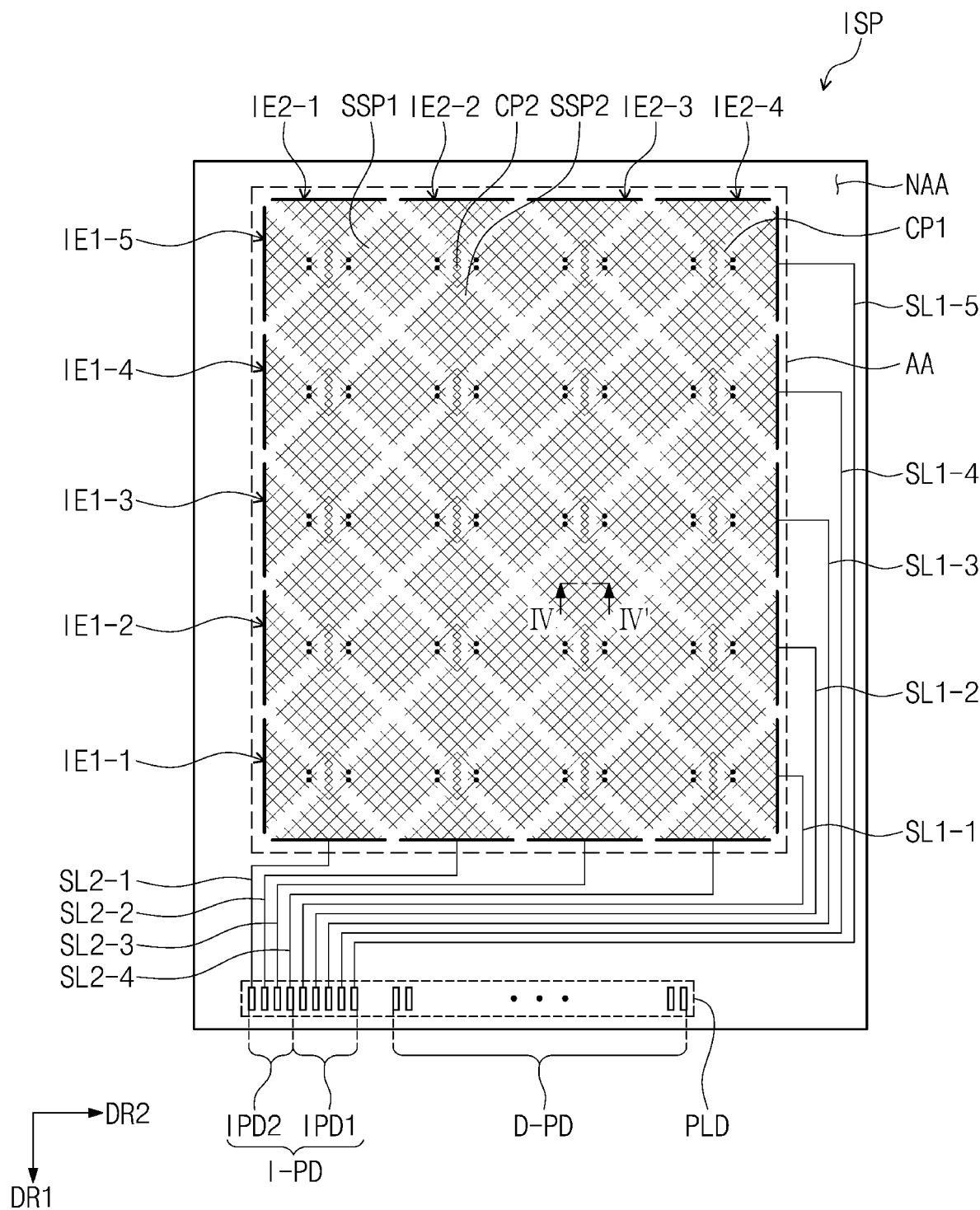
FIG. 12 is a plan view showing an input sensor according to an embodiment of the present inventive concept.

FIG. 12 is a plan view showing an input sensor ISP according to an embodiment of the present inventive concept. Hereinafter, detailed descriptions of the same elements as those described with reference to FIG. 5 will be omitted.

Referring to FIG. 12, the input sensor ISP according to an embodiment of the present inventive concept may include reception sensing electrodes IE1-1 to IE1-5, reception trace lines SL1-1 to SL1-5 connected to the reception sensing electrodes IE1-1 to IE1-5, transmission sensing electrodes IE2-1 to IE2-4, and transmission trace lines SL2-1 to SL2-4 connected to the transmission sensing electrodes IE2-1 to IE2-4.

The reception sensing electrodes IE1-4 to IE1-5 may cross the transmission sensing electrodes IE2-1 to IE2-4. For example, the reception sensing electrodes IE1-1 to IE1-5 may be arranged in the first direction DR1 and may extend in the second direction DR2. The transmission sensing electrodes IE2-1 to IE2-4 may be arranged in the second direction DR2 and may extend in the first direction DR1.

The input sensor ISP may obtain coordinate information by a mutual capacitance method. A capacitance may be formed between the reception sensing electrodes IE1-1 to IE1-5 and the transmission sensing electrodes IE2-1 to IE2-4. The capacitance between the reception sensing electrodes IE1-1 to IE1-5 and the transmission sensing electrodes IE2-1 to IE2-4 may be changed by an external input, for example, a touch event. The sensitivity of the input sensor ISP may be determined depending on a variation in capacitance. For example, as the variation in capacitance due to the external input increases, the sensitivity of the input sensor ISP may be increased.

Each of the reception sensing electrodes IE1-1 to IE1-5 may include first sensor portions SSP1 and first connection portions CP1, which are arranged in the active area AA. Each of the transmission sensing electrodes IE2-1 to IE2-4 may include second sensor portions SSP2 and second connection portions CP2, which are arranged in the active area AA.

FIG. 12 illustrates the reception sensing electrodes IE1-1 to IE1-5 and the transmission sensing electrodes IE2-1 to IE2-4 as having a particular shape, according to the present embodiment; however, this is merely an example and the shape of the reception sensing electrodes IE1-1 to IE1-5 and the transmission sensing electrodes IE2-1 to IE2-4 are not limited thereto or thereby. According to an embodiment of the present inventive concept, the reception sensing electrodes IE1-1 to IE1-5 and the transmission sensing electrodes IE2-1 to IE2-4 may have a bar shape in which the sensor portion and the connection portion are not distinguished from each other. In FIG. 12, each of the first sensor portions SSP1 and the second sensor portions SSP2 is illustrated as having a lozenge shape; however, the present inventive concept is not limited thereto. For example, the first sensor portions SSP1 and the second sensor portions SSP2 may have different polygonal shapes from each other.

In one reception sensing electrode, the first sensor portions SSP1 may be arranged in the second direction DR2, and in one transmission sensing electrode, the second sensor portions SSP2 may be arranged in the first direction DR1. Each of the first connection portions CP1 may connect the first sensor portions SSP1 adjacent to each other, and each of the second connection portions CP2 may connect the second sensor portions SSP2 adjacent to each other.

The reception sensing electrodes IE1-1 to IE1-5 and the transmission sensing electrodes IE2-1 to IE2-4 may each have a mesh shape. As the reception sensing electrodes IE1-1 to IE1-5 and the transmission sensing electrodes IE2-1 to IE2-4 each have the mesh shape, the parasitic capacitance between the electrodes of the display panel DP (refer to FIG. 4) and the reception sensing electrodes IE1-1 to IE1-5 and the transmission sensing electrodes IE2-1 to IE2-4 may be reduced.

The reception sensing electrodes IE1-1 to IE1-5 and the transmission sensing electrodes IE2-1 to IE2-4, each of which have the mesh shape, may include, for example, silver, aluminum, copper, chromium, nickel, titanium, or the like, which may be processed at a low temperature; however, the present inventive concept is not limited thereto. Although the input sensor ISP is formed through successive processes, the organic light emitting diodes may be prevented from being damaged.

The reception trace lines SL1-1 to SL1-5 may be respectively connected to first ends of the reception sensing electrodes IE1-1 to IE1-5. In the present embodiment of the present inventive concept, the input sensor ISP may further include reception trace lines respectively connected to second ends of the reception sensing electrodes IE1-1 to IE1-5. The transmission trace lines SL2-1 to SL2-4 may be respectively connected to first ends of the transmission sensing electrodes IE2-1 to IE2-4. In the present embodiment of the present inventive concept, the input sensor ISP may further include transmission trace lines connected to second ends of the transmission sensing electrodes IE2-1 to IE2-4.

The reception trace lines SL1-1 to SL1-5 and the transmission trace lines SL2-1 to SL2-4 may be disposed in the peripheral area NAA of the input sensor ISP. The input sensor ISP may include input pads I-PD respectively extending from first ends of the reception trace lines SL1-1 to SL1-5 and the transmission trace lines SL2-1 to SL2-4 and may be disposed in the peripheral area NAA. The input pads I-PD may include first input pads IPD1 connected to the reception trace lines SL1-1 to SL1-5 and second input pads IPD2 connected to the transmission trace lines SL2-1 to SL2-4.

Figure 13:
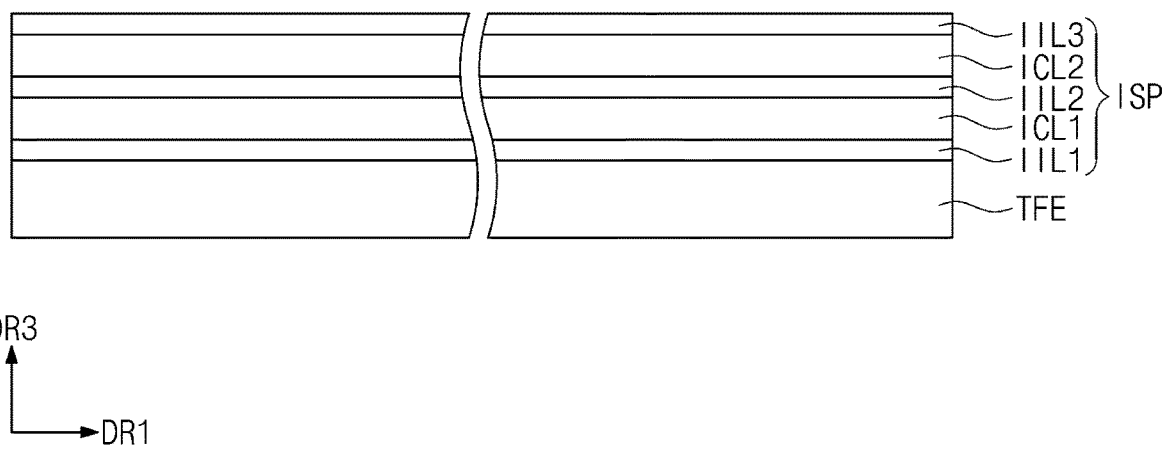
FIG. 13 is a cross-sectional view showing an input sensor according to an embodiment of the present inventive concept.

FIG. 13 is a cross-sectional view showing an input sensor ISP according to an embodiment of the present inventive concept. Referring to FIGS. 12 and 13, the input sensor ISP according to the embodiment of the present inventive concept may include a first sensing insulating layer IIL1, a first conductive layer ICL1, a second sensing insulating layer IIL2, a second conductive layer ICL2, and a third sensing insulating layer IIL3. The first sensing insulating layer IIL1 may be disposed on an encapsulation layer TFE. For example, the first sensing insulating layer IIL1 may be disposed directly on an encapsulation layer TFE. However, the present inventive concept is not limited thereto. For example, the first sensing insulating layer IIL1 may be omitted.

Each of the first conductive layer ICL1 and the second conductive layer ICL2 may include a plurality of conductive patterns. The conductive patterns may include sensing electrodes IE1-1 to IE1-5 and IE2-1 to IE2-4 and signal lines SL1-1 to SL1-5 and SL2-1 to SL2-4 connected to the sensing electrodes IE1-1 to IE1-5 and IE2-1 to IE2-4.

Each of the first sensing insulating layer IIL1, the second sensing insulating layer ILL2, and the third sensing insulating layer IIL3 may include an inorganic material and/or an organic material. In the present embodiment, each of the first sensing insulating layer IIL1 and the second sensing insulating layer IIL2 may be an inorganic layer. For example, the inorganic layer may include at least one of aluminum oxide, titanium oxide, silicon oxide, silicon oxynitride, zirconium oxide, and/or hafnium oxide. The inorganic layer may have a thickness of about 1000 angstroms to about 4000 angstroms.

The third sensing insulating layer IIL3 may be an organic layer. For example, the organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

Figure 14:
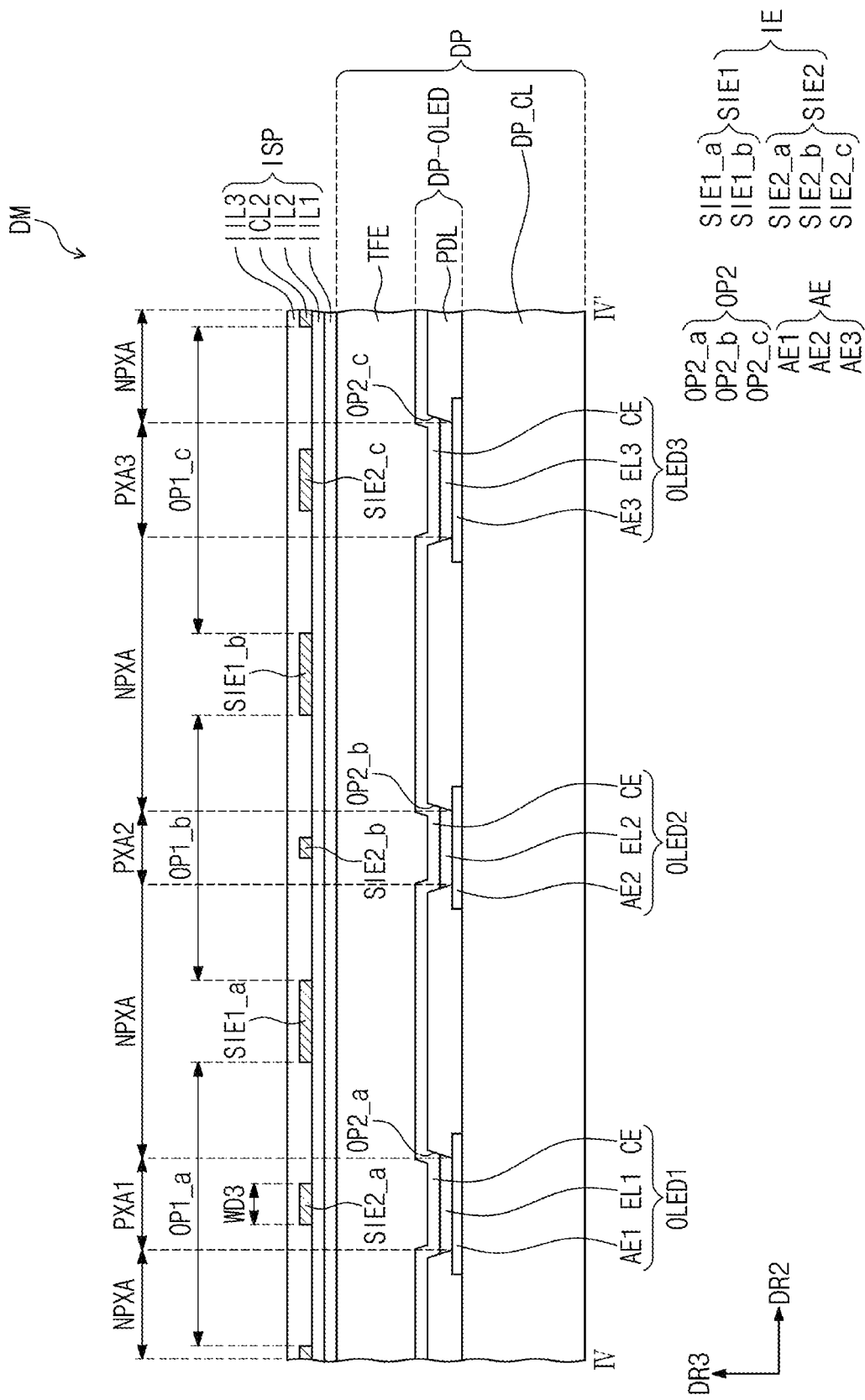
FIG. 14 is a cross-sectional view taken along a line IV-IV' of FIG. 12 to show a display module.

FIG. 14 is a cross-sectional view taken along a line IV-IV' of FIG. 12 to show a display module according to an embodiment of the present inventive concept. Hereinafter, detailed descriptions of the same elements described with reference to FIGS. 6A and 8B will be omitted.

Referring to FIGS. 12 and 14, the second conductive layer ICL2 may be disposed on the second sensing insulating layer IIL2, As an example, the second conductive layer ICL2 may include the reception sensing electrodes IE1-1 to IE1-5 and the transmission sensing electrodes IE2-1 to IE2-4. FIG. 14 shows, as an example, a cross-section of a portion of the transmission sensing electrode IE2-3 (hereinafter, referred to as a third transmission sensing electrode) arranged in a third column, which is taken along the line IV-IV' shown in FIG. 12.

The third transmission sensing electrode IE2-3 may include a first touch electrode SIE1 and a second touch electrode SIE2. The first touch electrode SIE1 may overlap the non-light-emitting area NPXA, and the second touch electrode SIE2 may overlap the light emitting area PXA. However, the present inventive concept is not limited thereto. For example, the second touch electrode SIE2 may overlap the non-light-emitting area NPXA and the light emitting area PXA. The third transmission sensing electrode IE2-3 may further include the second touch electrode SIE2, which is disposed on the same layer as the first touch electrode SIE1, in addition to the first touch electrode SIE1 and thus, the sensitivity of the input sensor ISP with respect to the external input may be increased.

While the present inventive concept has been described with reference to embodiments thereof, it will be understood by those of ordinary skill in the art that various changes in form and details may be made thereto without departing from the spirit and scope of the present inventive concept.

What is claimed is:

1. A display device comprising:
   a display panel configured to display an image and comprising a light emitting area and a non-light-emitting area adjacent to the light emitting area, wherein a light emitting element is disposed in the tight emitting area; and
   an input sensor disposed on the display panel and comprising a sensing electrode, wherein an opening in the sensing electrode partially exposes the light emitting area, wherein the sensing electrode comprises:
   a first touch electrode disposed to overlap the non-light-emitting area; and
   a second touch electrode overlapping the light emitting area and the non-light-emitting area and electrically connected to the first touch electrode,
   wherein the first touch electrode is spaced apart from the second touch electrode, and
   wherein the first touch electrode and the second touch electrode are directly disposed on a same layer,
   wherein a surface of the first touch electrode that is closest to the display panel is coplanar with a surface of the second touch electrode that is closest to the display panel.

2. The display device of claim 1, wherein the light emitting element comprises:
   a first light emitting element emitting a first light with a first wavelength band;
   a second light emitting element emitting a second light with a second wavelength band different from the first wavelength band; and
   a third light emitting element emitting a third light with a third wavelength band different from the first and second wavelength hands, and the light emitting area comprises:
   a first light emitting area in which the first light emitting element is disposed;
   a second light emitting area in which the second light emitting element is disposed; and
   a third light emitting area in which the third light emitting element is disposed.

3. The display device of claim 2, wherein the second touch electrode comprises:
   a first sensing portion overlapping at least one of the first, second, and third light emitting areas; and
   a second sensing portion connected to the first sensing portion and overlapping the non-light-emitting area.

4. The display device of claim 3, wherein the second sensing portion is disposed in the non-light-emitting area and spaced apart from the first touch electrode.

5. The display device of claim 2, wherein the second touch electrode comprises:
   a first portion overlapping the first light emitting area;
   a second portion overlapping the second light emitting area; and
   a third portion overlapping the third light emitting area.

6. The display device of claim 5, wherein at least one of the first, second, and third portions has a width greater than a width of the remainder of the first, second, and third portions.

7. The display device of claim 6, wherein the first light is a red light, the second light is a green light, and the third light is a blue light, and wherein the width of the third portion is greater than the width of each of the first and second portions, and the width of the first portion is greater than the width of the second portion.

8. The display device of claim 7, wherein the third light emitting area has a size greater than each of a size of the first light emitting area and a size of the second light emitting area, and the size of the first light emitting area is greater than the size of the second light emitting area.

9. The display device of claim 1, wherein the display panel further comprises an encapsulation layer disposed on the light emitting element.

10. The display device of claim 9, wherein the input sensor is disposed directly on the encapsulation layer.

11. The display device of claim 1, further comprising an adhesive film disposed between the display panel and the input sensor.

12. A display device comprising:
a display panel configured to display an image and comprising a light emitting area and a non-light-emitting area, wherein a light emitting element is disposed in the light emitting area; and
an input sensor disposed on the display panel and comprising a sensing electrode, wherein an opening in the sensing electrode at least partially exposes the light emitting area, and the sensing electrode comprises a touch electrode overlapping the light emitting area and the non-light-emitting area,
wherein the touch electrode overlaps only a portion of the light emitting area, wherein the light emitting element comprises:
a first light emitting element emitting a first light with a first wavelength band and disposed within boundaries of the sensing electrode;
a second light emitting element emitting a second light with a second wavelength band different from the first wavelength band and disposed within the boundaries of the sensing electrode;
a third light emitting element emitting a third light with a third wavelength band different from the first and second wavelength bands and disposed within the boundaries of the sensing electrode, wherein, within the boundaries of the sensing electrode, the touch electrode overlaps only a portion of each of the first light emitting element, the second light emitting element, and the third light emitting element; and
a sensing insulating layer disposed on the touch electrode and in the light emitting area, wherein the sensing Insulating layer directly contacts lateral surfaces, which are substantially perpendicular to a major surface of the display panel, of the touch electrode in the light emitting area.

13. The display device of claim 12, wherein the light emitting area comprises:
a first light emitting area in which the first light emitting element is disposed;
a second light emitting area in which the second light emitting element is disposed; and
a third light emitting area in which the third light emitting element is disposed.

14. The display device of claim 13, wherein the touch electrode comprises:
a first sensing portion overlapping at least one of the first, second, or third light emitting areas; and
a second sensing portion connected to the first sensing portion and overlapping the non-light-emitting area.

15. The display device of claim 13, wherein the touch electrode comprises:
a first portion overlapping the first light emitting area;
a second portion overlapping the second light emitting area; and
a third portion overlapping the third light emitting area.

16. The display device of claim 15, wherein at least one of the first, second, or third portions has a width greater than a width of the remainder of the first, second, and third portions.

17. The display device of claim 16, wherein the first light is a red light, the second light is a green light, and the third light is a blue light, and wherein the width of the third portion is greater than the width of each of the first and second portions, and the width of the first portion is greater than the width of the second portion.

18. The display device of claim 17, wherein the third light emitting area has a size greater than each of a size of the first light emitting area and a size of the second light emitting area, and the size of the first light emitting area is greater than the size of the second light emitting area.

19. The display device of claim 12, wherein the display panel further comprises an encapsulation layer disposed on the light emitting element, and the input sensor is disposed on the encapsulation layer.

20. The display device of claim 12, further comprising an adhesive film disposed between the display panel and the input sensor.

* * * * *